(12) United States Patent
Hashim et al.

(10) Patent No.: US 8,951,072 B2
(45) Date of Patent: Feb. 10, 2015

(54) COMMUNICATION JACKS HAVING LONGITUDINALLY STAGGERED JACKWIRE CONTACTS

(71) Applicant: CommScope, Inc. of North Carolina, Hickory, NC (US)

(72) Inventors: Amid Hashim, Plano, TX (US); Wayne D. Larsen, Wylie, TX (US); Brian J. Fitzpatrick, McKinney, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 26 days.

(21) Appl. No.: 13/802,840

(22) Filed: Mar. 14, 2013

(65) Prior Publication Data

US 2014/0073196 A1 Mar. 13, 2014

Related U.S. Application Data

(60) Provisional application No. 61/699,903, filed on Sep. 12, 2012, provisional application No. 61/697,955, filed on Sep. 7, 2012.

(51) Int. Cl.
*H01R 24/00* (2011.01)
*H01R 13/6461* (2011.01)
*H01R 13/6466* (2011.01)
*H01R 13/6469* (2011.01)
(Continued)

(52) U.S. Cl.
CPC ........ *H01R 13/6461* (2013.01); *H01R 13/6466* (2013.01); *H01R 13/6469* (2013.01); *H01R 24/64* (2013.01); *H05K 1/0228* (2013.01); *H05K 1/0239* (2013.01); *H05K 1/147* (2013.01); *H05K 1/162* (2013.01); *H05K 2201/10189* (2013.01)

USPC .......................................................... 439/676

(58) Field of Classification Search
CPC .... H01R 23/005; H01R 23/025; H01R 13/64; H01R 13/66
See application file for complete search history.

(56) References Cited

U.S. PATENT DOCUMENTS

| 6,017,247 A | 1/2000 | Gwiazdowski |
| 6,428,362 B1 | 8/2002 | Phommachanh |

(Continued)

FOREIGN PATENT DOCUMENTS

| CA | 2 464 834 A1 | 10/2005 |
| DE | 10 2007 00959 A1 | 8/2008 |
| FR | 2 919 434 A1 | 1/2009 |

OTHER PUBLICATIONS

Notification of Transmittal of the International Search Report and the Written Opinion of the International Searching Authority, or the Declaration for PCT/fUS2013/057265, dated Dec. 6, 2013, 10 pages.

(Continued)

*Primary Examiner* — Chandrika Prasad
(74) *Attorney, Agent, or Firm* — Myers Bigel Sibley & Sajovec, P.A.

(57) ABSTRACT

Communications jacks include a housing having a plug aperture that is configured to receive a mating RJ-45 plug along a longitudinal axis and eight jackwire contacts that are arranged as four differential pairs of jackwire contacts, each of the jackwire contacts including a plug contact region that extends into the plug aperture. A first of the jackwire contacts is configured to engage a longitudinally extending surface of a first blade of a mating RJ-45 plug when the mating RJ-45 plug is fully received within the plug aperture.

26 Claims, 13 Drawing Sheets

(51) Int. Cl.
*H01R 24/64* (2011.01)
*H05K 1/02* (2006.01)
*H05K 1/14* (2006.01)
*H05K 1/16* (2006.01)

(56) References Cited

U.S. PATENT DOCUMENTS

| | | | |
|---|---|---|---|
| 6,464,541 B1 | 10/2002 | Hashim et al. | |
| 6,641,443 B1 | 11/2003 | Itano et al. | |
| 7,179,131 B2 | 2/2007 | Caveney et al. | |
| 7,252,554 B2 | 8/2007 | Caveney et al. | |
| 7,264,516 B2 | 9/2007 | Hashim et al. | |
| 7,281,957 B2 | 10/2007 | Caveney et al. | |
| 7,320,624 B2 * | 1/2008 | Hashim et al. | 439/676 |
| 7,326,089 B2 | 2/2008 | Hashim | |
| 7,442,092 B2 | 10/2008 | Caveney et al. | |
| 7,591,686 B2 * | 9/2009 | Ellis et al. | 439/676 |
| 7,601,034 B1 | 10/2009 | Aekins et al. | |
| 7,670,193 B2 | 3/2010 | Milette et al. | |
| 7,682,203 B1 | 3/2010 | Pharney et al. | |
| 7,824,231 B2 | 11/2010 | Marti et al. | |
| 7,837,513 B2 | 11/2010 | Millette et al. | |
| 7,850,492 B1 | 12/2010 | Straka et al. | |
| 7,892,040 B2 * | 2/2011 | Ellis et al. | 439/676 |
| 7,976,348 B2 | 7/2011 | Aekins et al. | |
| 8,011,972 B2 | 9/2011 | Caveney et al. | |
| 2003/0232517 A1 | 12/2003 | Liu et al. | |
| 2005/0202697 A1 | 9/2005 | Caveney et al. | |
| 2007/0190863 A1 | 8/2007 | Caveney et al. | |
| 2007/0259571 A1 | 11/2007 | Chen | |
| 2010/0124855 A1 | 5/2010 | Milette et al. | |
| 2010/0190357 A1 | 7/2010 | Hashim | |
| 2010/0317230 A1 | 12/2010 | Larsen | |
| 2011/0065322 A1 | 3/2011 | Milette et al. | |
| 2011/0124219 A1 | 5/2011 | Milette et al. | |
| 2012/0156932 A1 | 6/2012 | Straka et al. | |
| 2012/0244752 A1 | 9/2012 | Patel et al. | |
| 2014/0073198 A1 * | 3/2014 | Moffitt et al. | 439/676 |

OTHER PUBLICATIONS

Engineering drawing and pictures of fixture for measuring crosstalk levels of fixture for measuring crosstalk levels in RJ-45 plugs, where the fixture has two rows of pogo-pin contacts that contact the longitudinal portion of the plug blade (Admitted Prior Art).

* cited by examiner

COMMUNICATION JACKS HAVING LONGITUDINALLY STAGGERED JACKWIRE CONTACTS

CROSS-REFERENCE TO RELATED APPLICATIONS

The present application claims priority under 35 U.S.C. §119(e) from U.S. Provisional Patent Application Ser. No. 61/699,903, filed Sep. 12, 2012 and to U.S. Provisional Patent Application Ser. No. 61/697,955, filed Sep. 7, 2012, the disclosure of each of which is hereby incorporated herein by reference in its entirety.

FIELD OF THE INVENTION

The present invention relates generally to communications connectors and, more particularly, to communications jacks.

BACKGROUND

Computers, fax machines, printers and other electronic devices are routinely connected by communications cables to network equipment such as routers, switches, servers and the like. FIG. 1 illustrates the manner in which a computer 10 may be connected to a network device 30 (e.g., a network switch) using conventional communications plug/jack connections. As shown in FIG. 1, the computer 10 is connected by a patch cord 11 to a communications jack 20 that is mounted in a wall plate 18. The patch cord 11 comprises a communications cable 12 that contains a plurality of individual conductors (e.g., eight insulated copper wires) and first and second communications plugs 13, 14 that are attached to the respective ends of the cable 12. The first communications plug 13 is inserted into a plug aperture of a communications jack (not shown) that is provided in the computer 10, and the second communications plug 14 is inserted into a plug aperture 22 in the front side of the communications jack 20. The contacts or "blades" of the second communications plug 14 are exposed through the slots 15 on the top and front surfaces of the second communications plug 14 and mate with respective "jackwire" contacts of the communications jack 20. The blades of the first communications plug 13 similarly mate with respective jackwire contacts of the communications jack (not shown) that is provided in the computer 10.

The communications jack 20 includes a back-end wire connection assembly 24 that receives and holds insulated conductors from a cable 26. As shown in FIG. 1, each conductor of cable 26 is individually pressed into a respective one of a plurality of slots provided in the back-end wire connection assembly 24 to establish mechanical and electrical connection between each conductor of cable 26 and a respective one of a plurality of conductive paths (not shown in FIG. 1) through the communications jack 20. The other end of each conductor in cable 26 may be connected to, for example, the network device 30. The wall plate 18 is typically mounted on a wall (not shown) of a room of, for example, an office building, and the cable 26 typically runs through conduits in the walls and/or ceilings of the office building to a room in which the network device 30 is located. The patch cord 11, the communications jack 20 and the cable 26 provide a plurality of signal transmission paths over which information signals may be communicated between the computer 10 and the network device 30. It will be appreciated that typically one or more patch panels, along with additional communications cabling, would be included in the communications path between the cable 26 and the network device 30. However, for ease of description, in FIG. 1 the cable 26 is shown as being directly connected to the network device 30.

In the above-described communications system, the information signals that are transmitted between the computer 10 and the network device 30 are typically transmitted over a pair of conductors (hereinafter a "differential pair" or simply a "pair") rather than over a single conductor. An information signal is transmitted over a differential pair by transmitting signals on each conductor of the pair that have equal magnitudes, but opposite phases, where the signals transmitted on the two conductors of the pair are selected such that the information signal is the voltage difference between the two transmitted signals. The use of differential signaling can greatly reduce the impact of noise on the information signal.

Various industry standards, such as the TIA/EIA-568-B.2-1 standard approved Jun. 20, 2002 by the Telecommunications Industry Association, have been promulgated that specify configurations, interfaces, performance levels and the like that help ensure that jacks, plugs and cables that are produced by different manufacturers will all work together. By way of example, the TIA/EIA-568-C.2 standard (August 2009) is designed to ensure that plugs, jacks and cable segments that comply with the standard will provide certain minimum levels of performance for signals transmitted at frequencies of up to 500 MHz. Most of these industry standards specify that each jack, plug and cable segment in a communications system must include eight conductors 1-8 that are arranged as four differential pairs of conductors. The industry standards specify that, in at least the connection region where the contacts (blades) of a plug mate with the jackwire contacts of the jack (referred to herein as the "plug-jack mating region"), the eight contacts in the plug are generally aligned in a row, as are the corresponding eight contacts in the jack. As shown in FIG. 2, which schematically illustrates the positions of the jackwire contacts of a jack in the plug-jack mating region, under the widely used TIA/EIA 568 type B configuration, in which conductors 4 and 5 comprise differential pair 1, conductors 1 and 2 comprise differential pair 2, conductors 3 and 6 comprise differential pair 3, and conductors 7 and 8 comprise differential pair 4. As known to those of skill in the art, conductors 1, 3, 5 and 7 comprise "tip" conductors, and conductors 2, 4, 6 and 8 comprise "ring" conductors.

Unfortunately, the industry-standardized configuration for the plug-jack mating region that is shown in FIG. 2, which was adopted many years ago, generates a type of noise known as "crosstalk." As is known to those of skill in this art, "crosstalk" refers to unwanted signal energy that is induced onto the conductors of a first "victim" differential pair from a signal that is transmitted over a second "disturbing" differential pair. The induced crosstalk may include both near-end crosstalk (NEXT), which is the crosstalk measured at an input location corresponding to a source at the same location (i.e., crosstalk whose induced voltage signal travels in an opposite direction to that of an originating, disturbing signal in a different path), and far-end crosstalk (FEXT), which is the crosstalk measured at the output location corresponding to a source at the input location (i.e., crosstalk whose signal travels in the same direction as the disturbing signal in the different path). Both types of crosstalk comprise an undesirable noise signal that interferes with the information signal on the victim differential pair.

Various techniques have been developed for cancelling out the crosstalk that arises in industry standardized plugs and jacks. Many of these techniques involve providing crosstalk compensation circuits in each communications jack that introduce "compensating" crosstalk that cancels out much of the "offending" crosstalk that is introduced in the plug and the plug-jack mating region due to the industry-standardized plug-jack interface. In order to achieve high levels of crosstalk cancellation, the industry standards specify small, pre-defined ranges for the crosstalk that is injected between the four differential pairs in each communication plug, which allows each manufacturer to design the crosstalk compensation circuits in their communications jacks to cancel out these pre-defined amounts of crosstalk.

Unfortunately, due to the industry-standardized plug-jack interface, there generally is a spatial separation, and hence a corresponding time delay, between the region where the offending crosstalk is injected between conductive paths of the mated plug and jack and the region where the compensating crosstalk is injected. As hard-wired communications systems move to higher frequency signals (as is necessary to support higher data rate communications), this delay degrades the effectiveness of conventional crosstalk compensation schemes. In particular, conventional crosstalk compensation schemes couple signal energy from a second conductor of a disturbing differential pair onto a victim differential pair in order to cancel out the offending crosstalk that is generated when the first conductor of the disturbing differential pair couples energy onto the victim differential pair (e.g., in the plug-jack mating region). This compensation scheme works because the signals carried by the two conductors of the disturbing differential pair are phase-shifted by 180 degrees, and hence the signal energy coupled from the second conductor of the disturbing differential pair may be used to cancel out the signal energy coupled from the first conductor of the disturbing differential pair. However, because of the time delay between the points where the offending and compensating crosstalk signals are injected onto the victim differential pair, a phase shift will occur in the signal such that the offending and compensating crosstalk signals are not quite 180 degrees separated in phase. When higher frequency signals are used, the amount of this phase shift can become significant, which degrades the effectiveness of the crosstalk compensation.

In order to address the problem of phase shift at higher frequencies, so-called "multi-stage" crosstalk compensation schemes were developed, as disclosed, for example, in U.S. Pat. No. 5,997,358 to Adriaenssens et al. (hereinafter "the '358 patent"). Most high performance communications jacks that are in use today employ "multi-stage" crosstalk compensation circuits. With multi-stage crosstalk compensation, a first stage of "compensating" crosstalk may be provided (which has a polarity that is opposite the polarity of the offending crosstalk) that not only compensates for the offending crosstalk, but in fact over-compensates. Then, a second stage of compensating crosstalk is provided that has the same polarity as the offending crosstalk that cancels out the over-compensating portion of the first stage of compensating crosstalk. As explained in the '358 patent, the entire content of which is hereby incorporated herein by reference as if set forth fully herein, these multi-stage compensating schemes can theoretically completely cancel an offending crosstalk signal at a specific frequency and can provide significantly improved crosstalk cancellation over a range of frequencies.

SUMMARY

Pursuant to embodiments of the present invention, RJ-45 communications jacks are provided that have a housing having a plug aperture that is configured to receive a mating RJ-45 plug along a longitudinal axis of the jack. These jacks further include eight jackwire contacts that are arranged as four differential pairs of jackwire contacts, each of the jackwire contacts including a plug contact region that extends into the plug aperture. A first of the jackwire contacts is configured to engage a longitudinally extending surface of a first blade of a mating RJ-45 plug when the mating RJ-45 plug is fully received within the plug aperture.

In some embodiments, a second of the jackwire contacts may also be configured to engage a longitudinally extending surface of a second blade of the mating RJ-45 plug when the mating RJ-45 plug is fully received within the plug aperture. In such embodiments, the first jackwire contact may engage the longitudinal surface of the first blade of the mating RJ-45 plug at a first distance from a plane defined by a front opening of the plug aperture, and the second jackwire contact may engage the longitudinal surface of the second blade of the mating RJ-45 plug at a second distance from the plane defined by the front opening of the plug aperture, where the second distance exceeds the first distance. In some embodiments, the second distance may exceed the first distance by at least 20 mils.

In some embodiments, a second of the jackwire contacts may be configured to engage a curved surface of a second blade of the mating RJ-45 plug when the mating RJ-45 plug is fully received within the plug aperture. The curved surface may be a surface that connects a longitudinally extending surface of the second blade to a front surface of the second blade. Additionally, a second of the jackwire contacts may be configured to engage a second blade of the mating RJ-45 plug when the mating RJ-45 plug is fully received within the plug aperture, and first and second of the jackwire contacts may be offset longitudinally, transversely and vertically when the mating RJ-45 plug is fully received within the plug aperture.

In some embodiments, all eight jackwire contacts may be configured to engage respective longitudinal surfaces of their corresponding blades of the mating plug when the mating plug is fully received within the plug aperture. In such embodiments, a first subset of the jackwire contacts may engage the longitudinal surfaces of their mating plug blades at a first distance from a first plane defined by a front opening of the plug aperture, and a second subset of the jackwire contacts may engage the longitudinal surfaces of their mating plug blades at a second distance from the first plane. The second distance may exceed the first distance. In some embodiments, all of the tip jackwire contacts may be at the same distance from the first plane, and all of the ring jackwire contacts may be at the same distance from the first plane.

In some embodiments, each of the jackwire contacts may be mounted to extend from a top surface of a printed circuit board, and the portion of each jackwire contact that is at a maximum height above a plane defined by the top surface of the printed circuit board may be the plug contact region of the jackwire contact.

Pursuant to further embodiments of the present invention, RJ-45 communications jacks are provided that include a housing having a plug aperture. These jacks further include first through eighth jackwire contacts that are arranged into differential pairs according to the TIA/EIA 568 type B configuration. The plug contact regions of the first and third differential pairs of jackwire contacts are staggered so that the third jackwire contact couples at least as much with the fifth jackwire contact as it does with the fourth jackwire contact.

In some embodiments, the plug contact regions of the first and third differential pairs of jackwire contacts may also be staggered so that the sixth jackwire contact couples at least as much with the fourth jackwire contact as it does with the fifth jackwire contact. The first, third, fifth and seventh jackwire contacts may be substantially aligned in a first row, and the second, fourth, sixth and eighth jackwire contacts may be substantially aligned in a second row that is offset from the first row.

In some embodiments, the plug blade contact regions of at least half of the jackwire contacts may be configured to mate with a flat bottom portion of a respective plug blade of a mating RJ-45 plug when the mating RJ-45 plug is fully received within the plug aperture. The jack may also include a flexible printed circuit board that electrically connects each of the jackwire contacts to respective ones of first through eighth output terminals of the jack. In such embodiments, each jackwire contact may have a first end that is mounted in the flexible printed circuit board and a second end that is mounted in a mounting substrate.

Pursuant to additional embodiments of the present invention, RJ-45 communications jacks are provided that include a housing having a plug aperture that is configured to receive a mating RJ-45 plug along a longitudinal axis of the jack. The jacks also include at least one printed circuit board and first through eighth jackwire contacts that are arranged into differential pairs according to the TIA/EIA 568 type B configuration. Each jackwire contact has a first end and a second end, and both the first ends and the second ends of at least some of the jackwire contacts are mounted in the at least one printed circuit board. Additionally, the jackwire contacts are mounted in at least two transverse rows across the plug aperture.

In some embodiments, the first, third, fifth and seventh jackwire contacts may be substantially aligned in a first row, and the second, fourth, sixth and eighth jackwire contacts may be substantially aligned in a second row that is longitudinally offset from the first row. One of the jackwire contacts may be designed to inject a first signal that is transmitted from the RJ-45 communications jack into a mating RJ-45 plug at a first location that is a first distance from a front surface of the mating RJ-45 plug while another of the jackwire contacts may be designed to inject a second signal that is transmitted from the RJ-45 communications jack into a mating RJ-45 plug at a second location that is a second distance from the front surface of the mating RJ-45 plug, where the first distance exceeds the second distance by at least 10 mils.

In some embodiments, the at least one printed circuit board may be a flexible printed circuit board. The jackwire contacts of the first and third differential pairs may be crosstalk neutral or introduce compensating crosstalk that has a polarity opposite the polarity of an offending crosstalk that is generated between the plug blades of the first and third differential pairs of a mating RJ-45 plug. The at least one printed circuit board may include a first flexible printed circuit board and a second printed circuit board, and the first end of each of the jackwire contacts may be mounted in the first flexible printed circuit board and the second end of at least some of the jackwire contacts may be mounted in the second printed circuit board. In other embodiments, a single flexible printed circuit board may be provided, and both ends of each of the jackwire contacts (or at least some of them) may be mounted in this flexible printed circuit board.

Pursuant to yet additional embodiments of the present invention, communications jacks are provided that include a housing, a printed circuit board that is at least partially mounted within the housing, a plurality of jackwire contacts and a flexible printed circuit board that is mounted on at least two of the jackwire contacts, the flexible printed circuit board including at least one crosstalk compensation circuit. The plug contact surfaces of a first subset of the jackwire contacts are substantially aligned in a first transverse row, and the plug contact surfaces of a second subset of the jackwire contacts are substantially aligned in a second transverse row that is offset from the first transverse row.

In some embodiments, the flexible printed circuit board may comprise a first flexible printed circuit board, and the printed circuit board may comprise a second flexible printed circuit board. In some embodiments, the first flexible printed circuit board may include a fold and/or a slit. The jackwire contacts may include first through eighth jackwire contacts that are arranged into differential pairs according to the TIA/EIA 568 type B configuration. In such embodiments, the at least one crosstalk compensation circuit may comprise at least one capacitor that is coupled between the third jackwire contact and the fifth jackwire contact. The jack may further include a third flexible printed circuit board that is mounted on the fourth jackwire contact and the sixth jackwire contact, the third flexible printed circuit board including a second crosstalk compensation circuit that comprises at least one capacitor coupled between the fourth jackwire contact and the sixth jackwire contact. The first flexible printed circuit board may be mounted to a portion of the at least two jackwire contacts that are on opposite sides of the contacts from the plug contact surfaces thereof.

Pursuant to yet additional embodiments of the present invention, communications jacks are provided that include a housing having a plug aperture, a plurality of jackwire contacts that each have a plug contact surface that is exposed within the plug aperture, and a flexible printed circuit board that is mounted on first and second of the jackwire contacts opposite the plug contact surfaces of the first and second of the jackwire contacts. The flexible printed circuit board includes at least one crosstalk compensation circuit, and also includes at least one fold and/or slit.

Pursuant to still further embodiments of the present invention, communications jacks are provided that include a plurality of input contacts, a plurality of output contacts and a plurality of conductive paths that each electrically connect a respective one of the input contacts to a respective one of the output contacts, the conductive paths being arranged as a plurality of differential pairs of conductive paths. These jacks further include a first crosstalk compensation stage that is provided between first and second of the differential pairs of conductive paths, the first crosstalk compensation stage configured to inject crosstalk having a first polarity between the first and second of the differential pairs of conductive paths. The jacks further include a second crosstalk compensation stage that is provided between the first and second of the differential pairs of conductive paths, the second crosstalk compensation stage including an inductive sub-stage that is configured to inject inductive crosstalk having the first polarity between the first and second of the differential pairs of conductive paths and a capacitive sub-stage that is configured to inject capacitive crosstalk having a second polarity between the first and second of the differential pairs of conductive paths, the second polarity being opposite the first polarity. The capacitive sub-stage is a distributed capacitive sub-stage.

In some embodiments, the capacitive sub-stage and the inductive sub-stage may inject substantially the same amount of crosstalk as a function of time so as to be substantially self-cancelling at frequencies up to 2 GHz. The second crosstalk compensation stage may comprise a first trace of the first differential pair on a first side of a flexible printed circuit board and a second trace of the second differential pair on a second side of the flexible printed circuit board that at least partially overlaps the first trace. At least one of the first trace or the second trace may be a widened trace that is configured to have increased capacitive coupling with the other of the first trace or the second trace. The first trace may only partially overlap the second trace, and the degree of overlap may be selected to match the amounts of inductive and capacitive crosstalk injected in the second stage. The second crosstalk compensation stage may be formed by both inductively and capacitively coupling a tip conductive path of the first differential pair of conductive paths and a ring conductive path of the second differential pair of conductive paths. In such embodiments, the inductively and capacitively coupled portions of the tip conductive path of the first differential pair of conductive paths and the ring conductive path of the second differential pair of conductive paths may be mounted on opposite sides of a flexible printed circuit board.

Pursuant to additional embodiments of the present invention, RJ-45 communications jacks are provided that include eight inputs, eight outputs and eight conductive paths that connect the eight inputs to the respective eight outputs, where the conductive paths are arranged into differential pairs according to the TIA/EIA 568 type B configuration. These jacks further include a first crosstalk compensation stage that comprises at least a first capacitor that is coupled between either the third conductive path and the fourth conductive path or between the fifth conductive path and the sixth conductive path, and a second crosstalk compensation stage that comprises at least an inductive coupling section between either the third conductive path and the fourth conductive path or between the fifth conductive path and the sixth conductive path. The first capacitor is a distributed capacitor that injects capacitance at multiple locations between the first and third differential pairs of conductive paths, and the first and second compensating stages substantially cancel one another.

In some embodiments, the jacks further include a third crosstalk compensation stage that is configured to cancel crosstalk introduced between the first and third differential pairs of conductive paths in a mating RJ-45 plug and any crosstalk injected between the first and third differential pairs of conductive paths at the plug-jack interface. The conductive paths may be at least partly implemented on a flexible printed circuit board, and the inductive coupling section may comprise a first trace section on a first side of the flexible printed circuit board that inductively couples with a second trace section on the opposite side of the flexible printed circuit board. In such embodiments, the first and second trace sections may partly overlap but not completely overlap. The third crosstalk compensation stage may be located closer to the plug-jack mating point than are the first and second crosstalk compensation stages.

Pursuant to further embodiments of the present invention, communications jacks are provided that include a plurality of input contacts, a plurality of output contacts and a plurality of conductive paths that each electrically connect a respective one of the input contacts to a respective one of the output contacts, the conductive paths being arranged as a plurality of differential pairs of conductive paths that each have a tip conductive path and a ring conductive path. A first crosstalk compensation stage is provided between first and second of the differential pairs of conductive paths, the first crosstalk compensation stage being configured to inject crosstalk having a first polarity between the first and second of the differential pairs of conductive paths. A second crosstalk compensation stage is also provided that comprises at least first and second coupling trace sections that are provided on opposite sides of a flexible printed circuit board, where the first and second coupling trace sections are configured to generate a first amount of inductive coupling per unit length and a second amount of capacitive coupling per unit length of the opposite polarity thereto.

In some embodiments, the first amount of inductive coupling per unit length and the second amount of capacitive coupling per unit length may be substantially equal. The first and second trace sections may partly overlap but not completely overlap. The first trace section may be part of a tip conductive path and the second trace section may be part of a ring conductive path. The first crosstalk compensation stage may be configured to cancel crosstalk introduced between the first and second of the differential pairs of conductive paths in a mating plug and any crosstalk injected between the first and second of the differential pairs of conductive paths at an interface of the mated plug and jack. The first crosstalk compensation stage may be located closer in time to the interface with the mated plug than is the second crosstalk compensation stage.

Pursuant to other embodiments, RJ-45 communications jacks are provided that include a housing having a plug aperture, at least one printed circuit board and first through eighth jackwire contacts that are arranged into differential pairs according to the TIA/EIA 568 type B configuration. Each of the jackwire contact has a first end that is positioned forwardly in the housing and a second end that is positioned rearward of the first end, and both the first ends and the second ends of at least some of the jackwire contacts are mounted in the at least one printed circuit board. Moreover, the signal current carrying path through at least one of the first through eighth jackwire contacts passes through the first end thereof while the signal current carrying path through at least another of the jackwire contacts passes through the second end thereof.

In some embodiments, the signal current-carrying path for each of the first, third, fifth and seventh jackwire contacts may extend in a first direction from the plug blade contact regions thereof and the signal current-carrying path for each of the second, fourth, sixth and eighth jackwire contacts may extend in a second direction from the plug blade contact regions thereof, the second direction being generally opposite the first direction. The at least one printed circuit board may be a flexible printed circuit board.

In some embodiments, the jacks may be configured so that variations in the amount of offending crosstalk generated between a first differential pair of jackwire contacts and a third differential pair of jackwire contacts based on a plug penetration depth of a mating plug into the plug aperture when the mating plug is latched into place within the plug aperture is offset by substantially equal and opposite changes in the amount of compensating crosstalk injected in the mated plug-jack combination between the first and third differential pairs of jackwire contacts.

Pursuant to still further embodiments of the present invention, communications jacks are provided that include at least four conductive paths that electrically connect four inputs of the jack to respective ones of four outputs of the jack, where the first and second conductive paths comprise a first differential pair and the third and fourth conductive paths comprise a second differential pair. These jacks further include a return loss improvement circuit that comprises a first section of the first conductive path and a second section of the second conductive path that has the same instantaneous current direction as the first section of the first conductive path, where the first and second sections are positioned to both capacitively and inductively couple with each other.

In some embodiments, the amount of capacitive coupling is at least half the amount of the inductive coupling. The jack may also include a flexible printed circuit board, and the first section of the first conductive path may be on a first side of the flexible printed circuit board and the second section of the second conductive path may be on a second side of the flexible printed circuit board that is opposite the first side. The ratio of the capacitive coupling to the inductive coupling in the return loss improvement circuit may be selected to provide a local maximum in a return loss spectrum. Moreover, the jack may include a second return loss improvement circuit that comprises a third section of the third conductive path and a fourth section of the fourth conductive path that has the same instantaneous current direction as the third section of the third conductive path, where the third section and the fourth section are positioned to both capacitively and inductively couple with each other.

Pursuant to yet other embodiments of the present invention, methods of controlling the return loss on a differential transmission line that includes a first conductive path and a second conductive path of an RJ-45 communications connector are provided in which a first section of the first conductive path and a first section of the second conductive path are routed so that the first and second sections have substantially the same instantaneous current direction and so that the first and second sections both capacitively and inductively couple with one another. The amounts of capacitive and inductive coupling between the first and second sections are then controlled to improve the return loss of the transmission line.

In some embodiments, controlling the amounts of capacitive and inductive coupling comprises selecting the amounts of capacitive and inductive coupling to create a resonance that generates a local maximum in the return loss spectrum within twice the operating frequency range of the communications jack. The first section may be on a first side of a flexible printed circuit board and the second section may be on a second side of the flexible printed circuit board that is opposite the first side. The first and second sections may at least partially overlap. In some embodiments, the first section may be a widened conductive trace that both inductively and capacitively couples through the flexible printed circuit board with a conductive trace that forms the second section. The amounts of capacitive and inductive coupling between the first and second sections may be controlled to improve the return loss of the transmission line by selecting widths for first and second conductive traces that are used to form the first and second sections and/or selecting a degree to which the first and second conductive traces overlap and/or a length of the overlapping sections of the first and second conductive traces.

Pursuant to further embodiments of the present invention, communications jacks are provided that include a housing having a plug aperture, a flexible printed circuit board that is at least partly mounted within the housing, a first conductive path electrically connecting a first input of the jack and a first output of the jack, and a second conductive path electrically connecting a second input of the jack and a second output of the jack, where the first and second conductive paths comprise a first differential pair of conductive paths. The first conductive path includes first and second conductive trace sections on the flexible printed circuit board that are immediately adjacent to each other and that have generally the same instantaneous current direction such that the first and second conductive trace sections self-couple and cause a localized increase in inductance. The first conductive trace section is on a first side of the flexible printed circuit board and the second conductive trace section is on a second side of the flexible printed circuit board that is opposite the first side. The first and second conductive trace sections are configured to both inductively and capacitively couple into each other.

In some embodiments, at least one of the conductive trace sections comprises a spiral. The first conductive trace section may at least partially overlap the second conductive trace section. An amount of capacitive coupling between the first and second conductive trace sections may be at least half an amount of inductive coupling between the first and second conductive trace sections.

Pursuant to still further embodiments of the present invention, RJ-45 communications jacks are provided that have a housing having a plug aperture that is configured to receive a mating RJ-45 plug along a longitudinal axis of the jack. The jacks also include a flexible printed circuit board having a first conductive path and a second conductive path that form a first differential pair of conductive paths and a third conductive path and a fourth conductive path that form a second differential pair of conductive paths. First through fourth jackwire contacts are electrically connected to the respective first through fourth conductive paths. A section of the first conductive path is on a first side of the flexible printed circuit board and a section of the third conductive path is on a second side of the flexible printed circuit board that is opposite the first side, and the section of the first conductive path and the section of the third conductive path are configured to form a coupling section in which the first and third conductive paths both inductively and capacitively couple.

In some embodiments, the section of the first conductive path and the section of the third conductive path that form the coupling section partially overlap but do not completely overlap. A first end of the coupling section and an intercept between the first jackwire contact and the first side of the flexible printed circuit board may be substantially transversely aligned. A first end of the coupling section and an intercept between the third jackwire contact and the second side of the flexible printed circuit board may be substantially transversely aligned. An intercept between the first jackwire contact and the first conductive path on the first side of the flexible printed circuit board and an intercept between the third jackwire contact and the third conductive path on the second side of the flexible printed circuit board may be substantially equidistant from a plane defined by a front opening of the plug aperture.

DETAILED DESCRIPTION

Figure 1:
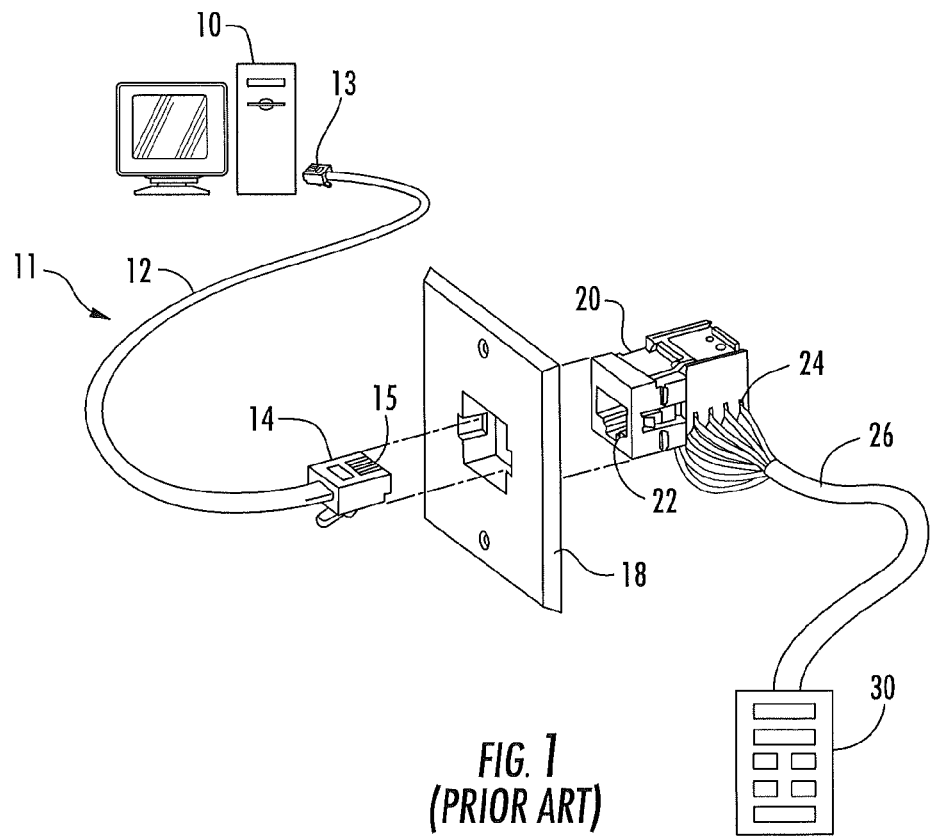
FIG. 1 is a schematic drawing that illustrates the use of communications plug and jack connectors to connect a computer to a network device.

Pursuant to embodiments of the present invention, communications jacks are provided that may operate at very high frequencies (e.g., frequencies of 1-2 GHz or more) while exhibiting good crosstalk cancellation and return loss performance.

In some embodiments, the communications jacks include a plurality of jackwire contacts that are electrically connected to a flexible printed circuit board. The jackwire contacts (which may also be referred to herein as a "leadframe") may be designed to reduce or minimize the amount of offending crosstalk that is generated within the leadframe. Generally speaking, the less offending crosstalk that is generated the better the performance of the jack, given the difficulty of perfectly cancelling such offending crosstalk. In some embodiments, the jackwire contacts may be arranged in a staggered fashion such that the jackwire contacts are disposed in two or more transverse rows. This stagger may reduce the amount of offending crosstalk that is generated in the plug contact regions of the jackwire contacts. In fact, in some embodiments, the stagger may be sufficiently pronounced that the leadframe may be "neutral" (i.e., does not generate any crosstalk between two differential pairs), or may even be compensating (i.e., does not generate any crosstalk between two differential pairs and also generates at least some compensating crosstalk between the two pairs). For example, according to embodiments of the present invention, RJ-45 jacks may be provided that are neutral or even compensating with respect to crosstalk between pairs 1 and 3 (specific references to pairs 1, 2, 3 and 4 herein are to pairs 1 through 4 as defined by the TIA/EIA type 568B configuration, while references to a "first pair", "second pair", etc. may be to any pair and need not necessarily refer to a pair of an industry standards compliant connector). As discussed above, this pair combination may have the most severe crosstalk issues.

In some embodiments, the staggered jackwire contacts may be designed to engage the bottom (longitudinal) surface of the respective blades of a mating plug as opposed to the curved transition sections of the plug blades that connect the front surface and bottom surface of each plug blade. As a result, the stagger in the jackwire contacts may be maintained even when a plug is fully received within the plug aperture of the jack. This may facilitate providing a leadframe that generates little or no additional offending crosstalk.

In some embodiments, the communications jacks may include first stage crosstalk compensation circuits that inject compensating crosstalk signals at a very small delay from the plug-jack mating point. These first stage crosstalk compensation circuits may be attached, for example, to non-signal current carrying ends of the jackwire contacts or may be attached to a printed circuit board that is mounted on the jackwire contacts substantially directly under the plug blade contact regions. By injecting first stage compensating crosstalk signals very near the plug jack mating point improved crosstalk cancellation may be achieved.

In some embodiments, single stage crosstalk compensation schemes may be used that further include a "transparent" second stage of crosstalk compensation. This transparent second stage may include inductive crosstalk having a first polarity and capacitive crosstalk that has a second polarity. The inductive and capacitive crosstalk components of the second stage may be injected at the same locations such that they substantially cancel each other out. In this manner, the ratio of inductive to capacitive crosstalk included in the crosstalk compensation circuitry may be adjusted, which allows optimization of both the NEXT and FEXT cancellation in the jack. In some embodiments, the transparent second stage of crosstalk compensation may be implemented as overlapping traces on opposite sides of a flexible printed circuit board that generate inductive crosstalk having a first polarity and capacitive crosstalk having a second polarity.

In some embodiments, the "signal current carrying path" through at least some of the jackwire contacts may flow in a different direction than the signal current carrying path through other of the jackwire contacts. Herein, the term "signal current carrying path" refers to the shortest physical path that a communications signal travels along a structure (e.g., a jackwire contact) when the signal passes through the structure on the way to its destination. For example, in some embodiments of RJ-45 jacks, the signal current carrying paths through the jackwire contacts for pair 3 may flow in a first direction while the signal current carrying paths through the remaining jackwire contacts may flow in a second, different direction. In other embodiments, the signal current carrying paths through the tip jackwire contacts may flow in a first direction while the signal current carrying paths through the ring jackwire contacts may flow in the second direction.

In some embodiments, various techniques may be used to improve the return loss of the differential transmission lines through the jack. For example, in some embodiments, the differential transmission lines may be configured so that the two conductors thereof both inductively and capacitively couple. These couplings may create resonances, and the resonances may be selected so that the return loss of the transmission line may be improved in a selected frequency range. In other embodiments, one or both conductors of a differential transmission line may be arranged so as to self-couple both inductively and capacitively to generate such resonances. High amounts of inductive and capacitive coupling may be generated by running the two traces of a differential pair (or a single trace that self-couples) on opposite sides of a flexible printed circuit board.

In some embodiments, high levels of inductive crosstalk compensation may be provided by routing the traces associated with two different differential pairs on opposite sides of a flexible printed circuit board in an overlapping arrangement. As the dielectric layer of flexible printed circuit boards may be very thin (e.g., 1 mil), very high amounts of inductive crosstalk compensation may be achieved in a very short distance. This may also facilitate moving the crosstalk compensation in the jack closer to the plug-jack mating point which, as discussed above, may often improve the crosstalk cancellation capabilities of the jack.

As discussed above, the present invention is primarily directed to communications jacks. As used herein, the terms "forward" and "front" and derivatives thereof refer to the direction defined by a vector extending from the center of the jack toward a plug aperture of the jack. The term "rearward" and derivatives thereof refer to the direction directly opposite the forward direction. The forward and rearward directions define the longitudinal dimension of the jack. The vectors extending from the center of the jack toward the respective sidewalls of the jack housing defines the transverse dimension of the jack. For RJ-45 jacks, the blades of an RJ-45 plug that is received within the plug aperture are aligned in a row along the transverse dimension. The transverse dimension is normal to the longitudinal dimension. The vectors extending from the center of the jack toward the respective top and bottom walls of the jack housing defines the vertical dimension of the jack. The vertical dimension of the jack is normal to both the longitudinal and transverse dimensions.

The communications jacks according to embodiments of the present invention may comprise, for example; RJ-45 or RJ-11 jacks, although embodiments of the present invention are not limited thereto.

Embodiments of the present invention will now be described with reference to the accompanying drawings, in which example embodiments are shown. Herein, when the communications jacks according to embodiments of the present invention include multiple of the same component, these components may be referred to individually by their full reference numerals (e.g., jackwire contact 140-4) and may be referred to collectively by the first part of their reference numeral (e.g., the jackwire contacts 140).

Figure 3:
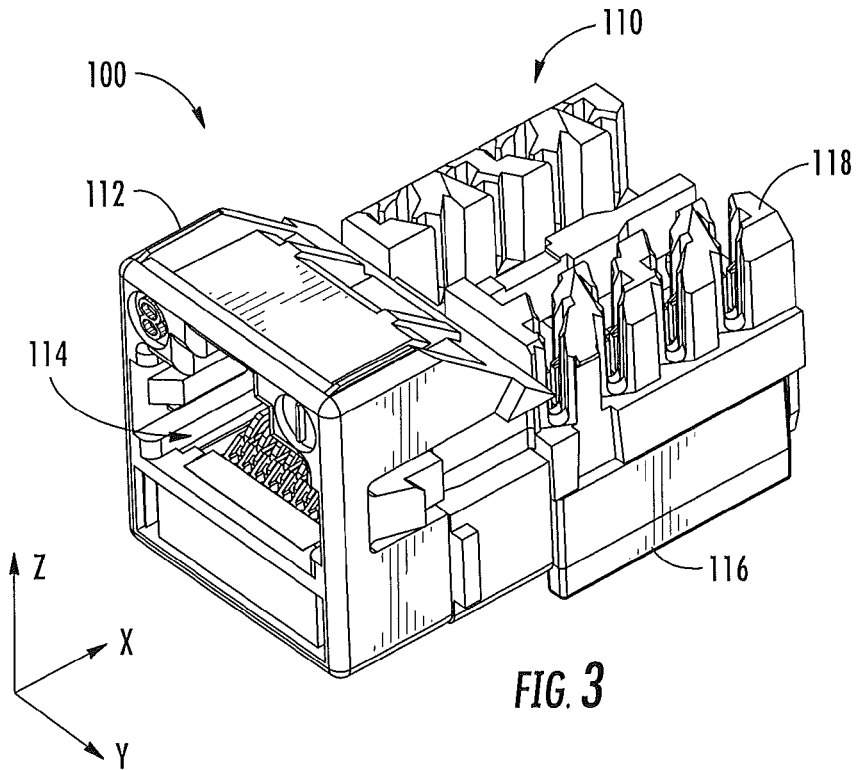
FIG. 3 is a perspective view of a communications jack according to embodiments of the present invention.
Figure 4:
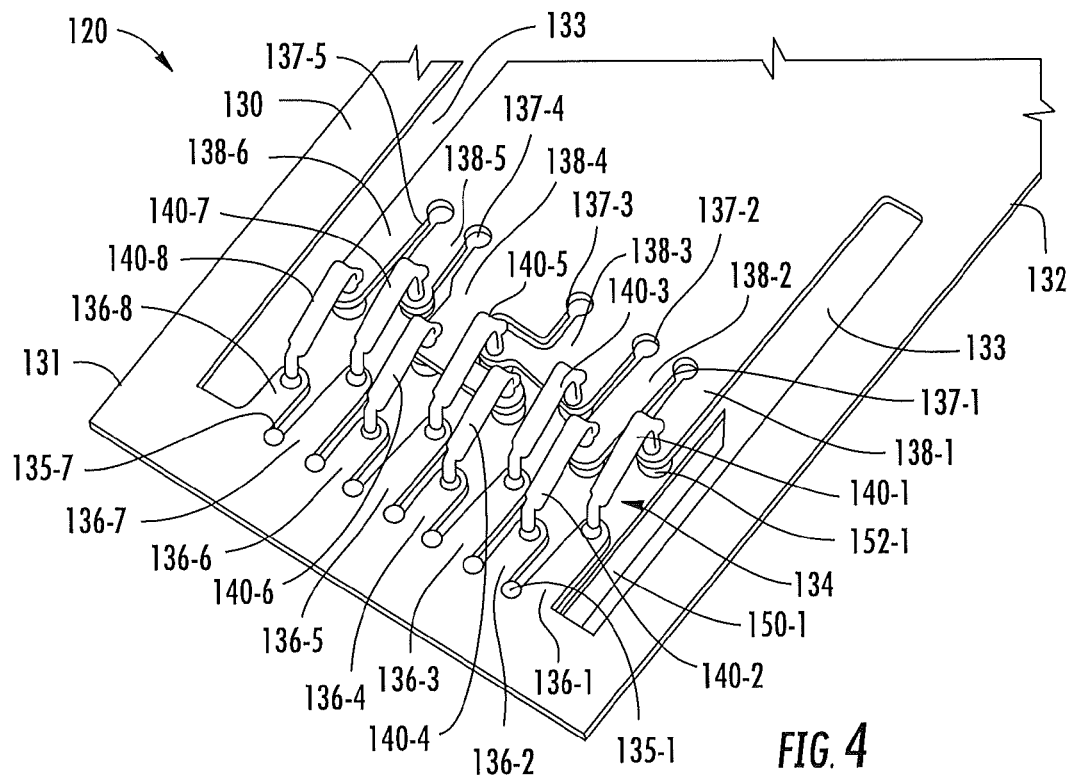
FIG. 4 is a schematic perspective view of a portion of a communications insert of the communications jack of FIG. 3.
Figure 5:
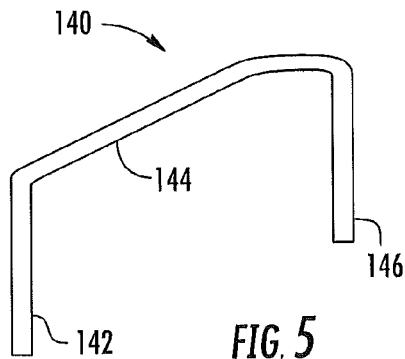
FIG. 5 is a side view of one of the jackwire contacts of the communications insert of FIG. 4.
Figure 6:
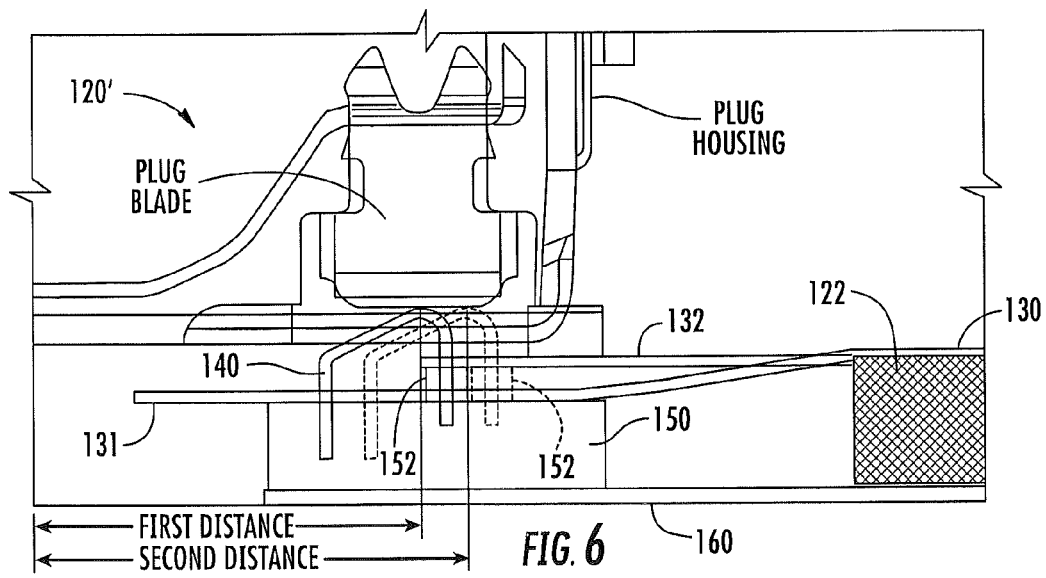
FIG. 6 is a schematic side cross-sectional view of the front portion of the communications insert of FIG. 4 taken along the longitudinal length of one of the jackwire contacts.
Figure 7:
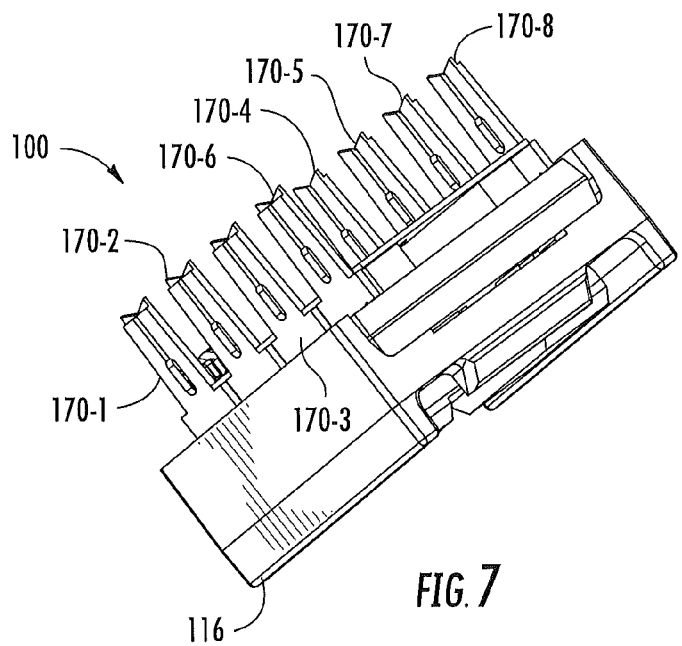
FIG. 7 is a perspective view of the rear portion of the jack of FIG. 3 with the terminal housing removed to expose the output terminals of the jack.
Figure 8:
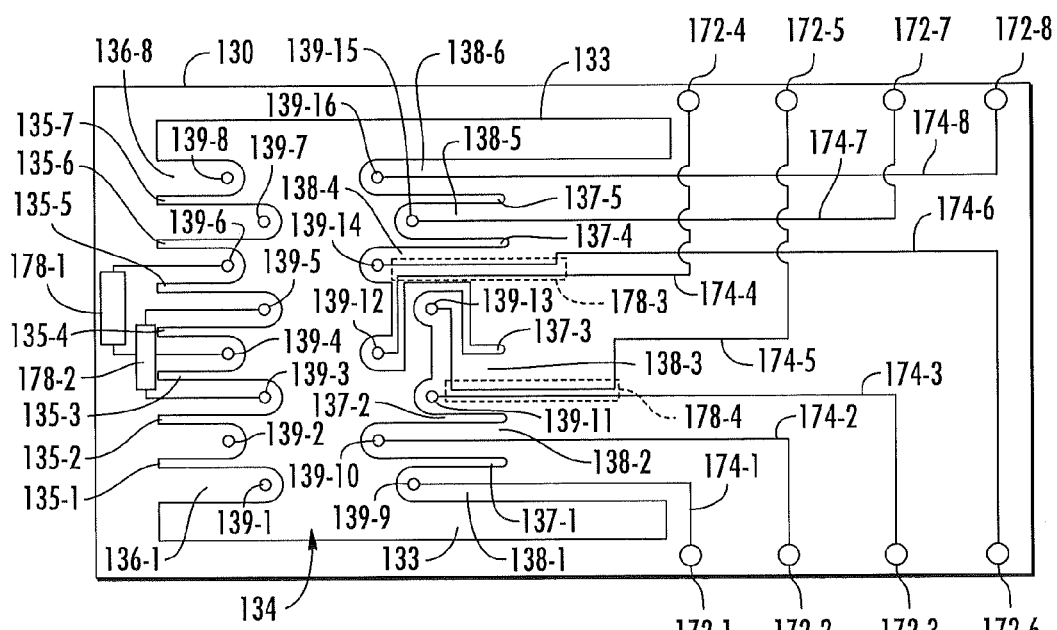
FIG. 8 is a schematic plan view of a flexible printed circuit board of the communications insert of FIG. 4.
Figure 9:
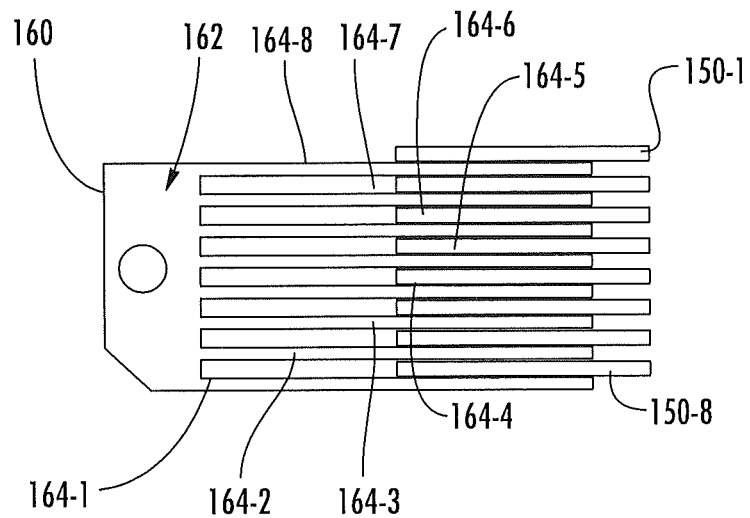
FIG. 9 is a schematic plan view of a spring of the communications insert of FIG. 4.

FIG. 3 is a perspective view of a communications jack 100 according to embodiments of the present invention. FIG. 4 is a schematic perspective view of a portion of a communications insert 120 for the communications jack 100. FIG. 5 is a side view of one of the jackwire contacts of the communications insert 120. FIG. 6 is a schematic side cross-sectional view of the front portion of the communications insert 120 taken along the longitudinal length of one of the jackwire contacts thereof. FIG. 7 is a perspective view of the rear portion of the jack 100 with the terminal housing removed to expose the output terminals of the jack. FIG. 8 is a schematic plan view of a flexible printed circuit board that is part of the communications insert 120. Finally, FIG. 9 is a schematic plan view of a spring of the communications insert of 120.

As shown in FIG. 3, the jack 100 includes a housing 110. In the depicted embodiment, the housing 110 includes a jack frame 112, a cover 116 and a terminal housing 118. The jack frame 112 includes a plug aperture 114 for receiving a mating communications plug. The housing components 112, 116, 118 may be conventionally formed and need not be described in detail herein. Those skilled in this art will recognize that other configurations of jack frames, covers and terminal housings may also be employed with the present invention, and that the housing 110 may have more or fewer than three pieces. It will also be appreciated that the jack 100, when mounted for use, is typically rotated 180 degrees about its longitudinal axis from the orientation shown in FIG. 3. In FIG. 3, the x-axis extends in the longitudinal direction, the y-axis extends in the transverse direction, and the z-axis extends in the vertical direction. In the discussion that follows, the relationships of the components of jack 100 with respect to each other will be described with respect to the orientation illustrated in the figures for convenience.

FIG. 4 illustrates a portion of a communications insert 120 of the jack 100. The forward portion of the communications insert 120 is received within an opening in the rear of the jack frame 112. The bottom of the communications insert 120 is protected by the cover 116, and the top of the communications insert 120 is covered and protected by the terminal housing 118. The communications insert 120 further includes a flexible printed circuit board 130, a plurality of jackwire contacts 140, a plurality of dielectric contact carriers 150 (only dielectric contact carrier 150-1 is visible in FIG. 4), a spring 160 (see FIG. 9) and a plurality of output contacts 170 (see FIG. 7), each of which will be discussed in further detail below. A substrate 122 (see FIG. 6) may be provided in some embodiments that may be disposed between the cover 116 and the flexible printed circuit board 130. The output contacts 170 may be mounted into both the flexible printed circuit board 130 and the underlying substrate 122 which provides additional mechanical support.

As shown best in FIGS. 4, 6 and 8, the flexible printed circuit board 130 may comprise an elongated printed circuit board that is formed of a flexible material that may be bent in various ways. The flexible printed circuit board 130 may comprise a fully flexible printed circuit board or a so-called "rigid-flex" printed circuit board that includes both flexible and rigid regions or sections. In the depicted embodiment, the flexible printed circuit board 130 includes a pair of longitudinal slots 133 that "decouple" a front portion 131 of the flexible printed circuit board 130 from the back portion 132. In particular, the slots 133 allow the front portion 131 of the flexible printed circuit board 130 to be moved within a range without substantially impacting the rear portion 132, and vice versa. As shown in FIG. 6, the slots 133 allow the front portion 131 of flexible printed circuit board 130 to be disposed at a lower level (vertically) within the jack housing 110 than the rear portion 132. The flexible printed circuit board 130 further includes a lateral slot 134 that extends between the pair of longitudinally-extending slots 133. While the communications insert 120 includes a single flexible printed circuit board 130, it will be appreciated that in other embodiments two or more printed circuit boards (or other substrates) may be provided. For example, the front portion 131 of the flexible printed circuit board 130 could be replaced with a first flexible or non-flexible printed circuit board and the rear portion 132 of flexible printed circuit board 130 could be replaced with a second flexible printed circuit board in other embodiments of the present invention. In some embodiments, the flexible printed circuit board 130 may be cut into two pieces (e.g., along the transverse slot 134) and mounted within the jack housing as two separate flexible printed circuit boards.

The flexible printed circuit board 130 may include one or more dielectric layers that may have conductive traces and/or other elements disposed on one or both sides thereof, as is known to those of skill in the art. The flexible printed circuit board 130 may be used as a transmission medium for signals that pass between the jackwire contacts 140 and the respective output contacts 170 of the jack 100, as will be explained in more detail with reference to FIG. 8. The flexible printed circuit board 130 may also include a plurality of crosstalk compensation circuits disposed thereon or therein, which will also be discussed in more detail below with reference to FIG. 8.

As is further shown in FIGS. 4 and 8, a plurality of longitudinal slots 135-1 through 135-7 are provided in the front portion 131 of the flexible printed circuit board 130 that define eight rearwardly facing fingers 136-1 through 136-8. Likewise, six longitudinal slots 137-1 through 137-6 are provided in the rear portion 132 of the flexible printed circuit board 130 that define a plurality of additional fingers 138-1 through 138-6. As shown in FIGS. 4 and 8, fingers 138-1, 138-2, 138-5 and 138-6 are generally longitudinally-extending fingers that face forwardly, while fingers 138-3 and 138-4 have both longitudinal and transverse components. Herein, a "finger" on a substrate such as a flexible printed circuit board refers to a cantilevered portion of the substrate, regardless of the particular shape. Thus, it will be understood that the fingers 136, 138 need not be elongated fingers.

The eight fingers 136 may move relatively independent of each other such that each finger 136 may be depressed a different distance downwardly when the jack 100 is mated with a communications plug. Likewise, the six fingers 138 may also move relatively independent of each other in this situation. The ability of each finger 136, 138 to move relatively independent of the other fingers 136, 138 may improve the performance and reliability of the jack 100.

In particular, various industry standards specify certain physical characteristics that must be met for a communications plug to qualify as an industry-standardized communications plug. The physical characteristics specified in these standards include the distances that portions of the plug blades must be from the bottom and front surfaces of the plug housing (when the plug is oriented as shown in FIG. 6), and the industry standards specify ranges for these distances to accommodate manufacturing tolerances. Because ranges are specified, a communications plug may be industry-standard compliant even though its plug blades are not all the same distance from the bottom and/or front surfaces of the plug housing (i.e., the blades may be offset from each other in the longitudinal direction and/or the vertical direction).

When a communications plug that has plug blades that are offset from each other is inserted into the jack 100, certain of the plug blades may engage their respective jackwire contacts 140 of jack 100 sooner than other of the plug blades. The subset of the jackwire contacts 140 that are initially engaged in this fashion exert a downward force on the flexible printed circuit board 130. If the flexible printed circuit board 130 did not include the fingers 136, 138, as the flexible printed circuit board 130 is pushed downwardly, it would draw the remaining jackwire contacts 140 downward as well (i.e., the jackwire contacts 140 that had not yet been engaged by their respective plug blades), pulling these jackwire contacts 140 away from their respective plug blades. As a result, some of the jackwire contacts 140 will exert a greater contact force against their respective plug blades (namely the jackwire contacts 140 that are initially contacted by the offset plug blades) than will other of the jackwire contacts 140. If the flexible printed circuit board 130 does not include the fingers 136, 138 this effect may be magnified such that, under certain circumstances, some of the jackwire contacts 140 may exhibit poor contact force (or even no contact force at all) against their respective plug blades. However, by providing the fingers 136, 138 on the flexible printed circuit board 130, the degree to which the movement of a first of the jackwire contacts 140 changes the position of other of the jackwire contacts 140 may be reduced, and hence the jack 100 may be less susceptible to performance degradation when used with plugs that have plug blades that are offset from each other in the longitudinal and/or vertical directions.

As shown best in FIGS. 4-6, eight low coupling jackwire contacts 140-1 through 140-8 are mounted in two rows on a top surface of the flexible printed circuit board 130. Herein, a "jackwire contact" refers to a conductive contact structure of the jack that is mounted in or on a structure so as to extend into the plug aperture of the jack. Each jackwire contact 140 is configured to mate with a blade (or other contact structure) of a communications plug that is received within the plug aperture 114 of the jack 100. As noted above, the jackwire contacts 140 may be collectively referred to in some instances herein as a "leadframe."

As shown in FIG. 5, each jackwire contact 140 has a first end 142, a second end 146 and a middle section 144 that includes a "plug contact region" (i.e., the portion of the jackwire contact 140 that engages the blade of a mating plug that is received within the plug aperture 114 of jack 100). The jackwire contacts 140 may be formed of, for example, a resilient metal such as beryllium-copper or phosphor-bronze, or a non-resilient metal such as copper or gold-plated copper. In some embodiments, the jackwire contacts 140 may comprise substantially rigid contacts, meaning that the jackwire contacts 140 do not flex more than a de minimis amount when engaged by the respective blades of a mating plug during normal use of the jack 100. The first end 142 of each jackwire contact 140 is mounted to extend upwardly from a respective one of the fingers 136. The first end 142 of each jackwire contact 140 may extend through a respective one of a plurality of metal-plated apertures 139-1 through 139-8 that are provided in the fingers 136 (see FIG. 8). The second end of each jackwire contact 140 is mounted to extend upwardly from a respective one of the fingers 138. The second end 146 of each jackwire contact 140 may extend through a respective one of a plurality of metal-plated apertures 139-9 through 139-16 that are provided in the fingers 138 (see FIG. 8). The metal-plated apertures 139-1 through 139-16 electrically connect each jackwire contact 140 to respective conductive traces or other structures on the flexible printed circuit board 130, as will be discussed in more detail below with reference to FIG. 8.

The first end 142 and the second end 146 of each jackwire contact 140 may each be mounted to be substantially perpendicular to a top surface of the flexible printed circuit board 130 (although they need not be). The middle portion 144 of each jackwire contact 140 may be raised above the top surface of the flexible printed circuit board 130 such that a gap or spacing exists between a lower surface of the middle portion 144 of each jackwire contact 140 and the upper surface of the flexible printed circuit board 130. Additionally, the middle portion 144 of each jackwire contact 140 may define an oblique angle with respect to the plane or planes that are defined by the top surface of the flexible printed circuit board 130, as is shown in FIG. 6.

In some embodiments (such as the depicted embodiment), all of the jackwire contacts 140 may have the same profiles. This may simplify the manufacturing process and may also reduce production costs. However, in other embodiments the jackwire contacts 140 may have different profiles. For example, jackwire contacts 140-1, 140-3, 140-5 and 140-7 may have a first profile, while jackwire contacts 140-2, 140-4, 140-6 and 140-8 may have a second profile that is different from the first profile. The jackwire contact profiles may be designed to reduce coupling between adjacent jackwire contacts 140 by reducing the size of the region where adjacent jackwire contacts 140 are close to each other.

As is shown in FIGS. 4 and 6, the communications insert 120 further includes eight dielectric contact carriers 150-1 through 150-8. Herein, a "contact carrier" refers to a structure that provides mechanical support to a jackwire contact. In the depicted embodiment, each contact carrier 150 comprises an elongated, generally planar strip of molded plastic. Each contact carrier 150 extends parallel to the longitudinal axis of the jack 100, and each contact carrier 150 may be longitudinally aligned with a respective one of the jackwire contacts 140. The contact carriers 150 are aligned side-by-side in a row (in numerical order) in the lateral direction. Each of the dielectric contact carriers 150 includes an upwardly-extending protrusion 152. Each of these protrusions 152 is aligned underneath a respective one of the fingers 138. The first end 142 of each jackwire contact 140 extends through a respective one of the fingers 136 into an aperture in a top surface of the contact carrier 150 that is positioned underneath the jackwire contact 140. The second end 146 of each jackwire contact 140 extends through a respective one of the fingers 138 into an aperture on a respective one of the protrusions 152 on the contact carrier 150 that is positioned underneath the jackwire contact 140. The protrusions 152 act to hold the lower surface of the flexible printed circuit board 130 above the main upper surface of the contact carriers 150 in order to allow the fingers 138 to more freely flex downwardly when a mating plug is received within the plug aperture 114. While not shown in the figures, it will be appreciated that a second, identical, protrusion 152 may also be included on each contact carrier 150 directly underneath each respective finger 136, and that the first end 142 of each respective jackwire contact 140 may be received in these respective second protrusions 152.

While only one of the dielectric contact carriers 150 (namely contact carrier 150-1) is fully illustrated in FIGS. 4 and 6, it will be appreciated that all of the contact carriers 150-1 through 150-8 may be identical except that the location of the protrusions 152 may be adjusted to be underneath the second end 146 of their mating jackwire contact 140. While the contact carriers 150 are completely separate from each other in the depicted embodiment, it will be appreciated that in other embodiments some of the contact carriers 150 may be connected to each other.

Each contact carrier 150 may be mounted to move within the jack 100, as will be discussed in more detail below with respect to FIG. 9. As the ends 142, 146 of each jackwire contact 140 are mounted in a respective one of the contact carriers 150, each dielectric contact carrier 150 and its respective jackwire contact 140 will move together as a single unit when a communications plug is inserted into the plug aperture 114 of jack 100 and physically engages the jackwire contacts 140.

Referring to FIGS. 6 and 9, it can be seen that the communications insert 120 further includes a spring 160. The spring 160 may comprise a comb-like structure that has a base 162 and eight fingers 164-1 through 164-8. The spring 160 may be implemented, for example, as a piece of resilient metal such as beryllium-copper or phosphor-bronze that is mounted, for example, to a bottom surface of the substrate 122 (or another substrate or housing piece of the jack 100) by any appropriate means. However, it will be appreciated that a wide variety of different materials may be used to form the spring 160, including other metals, plastics, etc., and it will also be appreciated that the spring 160 may be implemented in many different forms (e.g., as a coiled spring, a cantilevered spring, etc.). In the illustrated embodiment, a single spring 160 is provided that is used for all eight jackwire contacts 140, but it will be appreciated that in other embodiments more than one spring 160 may be provided (e.g., a separate spring 160 could be provided for each of the jackwire contacts 140).

Each of the contact carriers 150 may be mounted directly on top of a respective one of the eight fingers 164 of spring 160. Alternatively, each finger 164 of the spring may be attached to a side surface of the respective dielectric contact carriers 150. In either case, each finger 164 of the spring 160 is connected to a respective one of the jackwire contacts 140 through a respective one of the contact carriers 150. Each finger 164 of the spring 160 may "spring bias" its associated contact carrier 150 and jackwire contact 140 so that when the contact carrier 150 and jackwire contact 140 are pressed down a spring force is applied that urges the contact carrier 150 and jackwire contact 140 upwardly to return to their normal resting positions.

When a mating plug is received within the plug aperture 114, the plug blades deflect each respective jackwire contact 140 and its associated contact carrier 150 downwardly. The contact carriers 150, in turn, deflect each of the eight fingers 164 of spring 160 downwardly. As the spring 160 is resilient, the fingers 164 of the spring 160 exert an upward force on their respective contact carriers 150, thereby forcing each of the jackwire contacts 140 upwardly to ensure that each jackwire contact 140 engages its mating plug blade with sufficient contact force to ensure that a reliable electrical connection is maintained between the eight blades of the mating plug and the jackwire contacts 140 with which they respectively mate. The spring 160 may be electrically isolated by the contact carriers 150 from the jackwire contacts 140 (and hence is not part of the signal current carrying paths).

As the resiliency of the spring 160 provides the contact force (through the contact carriers 150) that presses the jackwire contacts 140 against the respective blades of a mating plug, the jackwire contacts 140 need not be mounted in cantilevered fashion, nor must they be resilient (although they may be). Consequently, in some embodiments, the jackwire contacts 140 may be very short in length, which can significantly reduce the amount of coupling between adjacent jackwire contacts 140, and hence the amount of offending crosstalk that is generated. For example, the jackwire contacts 140 may each be about 200 mils to about 230 mils in length, in contrast with typical conventional jackwire contacts which may be much longer range, for example, from about 400 mils to about 800 mils in length, or even more.

While not shown in the drawings, a plurality of guiding walls may be provided in, for example, the jack housing 110 that define a plurality of guiding slots therebetween. A portion of each of the contact carriers 150 may be positioned in a respective one of these slots. Each contact carrier 150 may move up and down within its respective slot in response to the insertion or removal of a mating plug, but the slots act to maintain each of the contact carriers 150, and hence the jackwire contacts 140 mounted thereon, in their proper transverse alignment within the plug aperture 114 in order to maintain the jackwire contacts 140 at desired distances from each other and to ensure that the jackwire contacts 140 are properly aligned with their mating plug blades.

As shown best in FIGS. 4, 6 and 8, the jackwire contacts 140 may be aligned in two rows in the lateral direction, with jackwire contacts 140-2, 140-4, 140-6 and 140-8 mounted in a first row that is farther forward on the flexible printed circuit board 130 than jackwire contacts 140-1, 140-3, 140-5 and 140-7, which are mounted in a second row.

FIG. 8 is a schematic plan view of the flexible printed circuit board 130. FIG. 8 more clearly pictures how the slots 133, 134, 135 and 137 are used to form the fingers 136-1 through 136-8 and 138-1 through 138-6 (note that fingers 136-2 through 136-7 are not numbered in FIG. 8 to simplify the drawing, but are aligned in numerical order between fingers 136-1 and 136-8). FIG. 8 also illustrates the metal-plated apertures 139-1 through 139-8 which receive the first end 142 of jackwire contacts 140-1 through 140-8, respectively, and metal-plated apertures 139-9 through 139-16 that receive the second ends 146 of jackwire contacts 140-1 through 140-8, respectively. The first and second ends 142, 146 of the jackwire contacts 140 can be permanently mounted into their respective metal-plated apertures 139-1 through 139-16 by any conventional means such as, for example, welding, soldering or including eye-of-the-needle terminations on the ends 142, 146 of each jackwire contact 140. In this fashion, the first end 142 and the second end 146 of each jackwire contact 140 may be electrically connected to conductive structures on the flexible printed circuit board 130 in order to allow electrical signals (and electrical power signals) to pass between the flexible printed circuit board 130 and the respective jackwire contacts 140.

The flexible printed circuit board 130 may act as a signal carrying structure that passes signals between the eight jackwire contacts 140 and respective ones of eight output contacts 170 of the jack 100. In particular, as is shown in the schematic diagram of FIG. 8, a plurality of conductive paths 174-1 through 174-8 are provided in or on the flexible printed circuit board 130. Each conductive path 174 connects a respective one of the metal-plated apertures 139-9 through 139-16 to a corresponding one of a plurality of metal-plated apertures 172-1 through 172-8 in order to provide eight conductive paths through the flexible printed circuit board 130. Each conductive path 174 may be formed, for example, as a unitary conductive trace that resides on a single layer of the flexible printed circuit board 130 or as two or more conductive traces that are provided on multiple layers of the flexible printed circuit board 130 and which are electrically connected through metal-filled vias or other layer transferring techniques known to those of skill in the art. The conductive traces 174 may be formed of conventional conductive materials such as, for example, copper, and are deposited on the flexible printed circuit board 130 via any deposition method known to those skilled in this art.

A plurality of crosstalk compensation circuits 178 such as, for example, interdigitated finger capacitors, plate capacitors, inductively coupling traces and the like may also be provided on and/or within the flexible printed circuit board 130. Two exemplary capacitive crosstalk compensation circuits 178-1, 178-2 in the form of plate capacitors (only the upper plate of each plate capacitor is visible) are illustrated in FIG. 8, as are two exemplary inductive crosstalk compensation circuits 178-3, 178-4. Either or both the capacitive crosstalk compensation circuits 178-1, 178-2 and/or the inductive crosstalk compensation circuits 178-3, 178-4 may be located on portions of the flexible printed circuit board 130 that move when a plug is inserted into the plug aperture 114 of jack 100. Each of these crosstalk compensation circuits will be discussed in more detail below.

As shown in FIG. 7, a plurality of output terminals 170-1 through 170-8 are also mounted to be in electrical contact with the flexible printed circuit board 130. In this particular embodiment, the eight output terminals 170 are implemented as insulation displacement contacts (IDCs) that are mounted in the metal-plated apertures 172-1 through 172-8 (see FIG. 8) in the flexible printed circuit board 130 and extend through the board 130 into the mounting substrate 122. As is well known to those of skill in the art, an IDC is a type of wire connection terminal that may be used to make mechanical and electrical connection to an insulated wire conductor. The IDCs 170 may be of conventional construction and need not be described in detail herein. Any other appropriate output contact may be used including, for example, insulation piercing contacts.

The communications jack 100 may exhibit improved crosstalk performance as compared to many conventional communications jacks.

As is known to those of skill in the art, modern communications jacks such as RJ-45 jacks typically include single-stage or multi-stage crosstalk compensation circuits that are designed to inject "compensating" crosstalk that cancels out "offending" crosstalk that is injected between two differential pairs in a mated communications jack and plug combination due to industry-standardized configurations of the plug blades and the jackwire contacts. However, the compensating crosstalk typically cannot be inserted at precisely the same locations where the offending crosstalk is injected, and thus the compensating crosstalk is typically injected at some delay after the offending crosstalk. Unfortunately, for communications signals at higher frequencies (e.g., at frequencies above 100 MHz and, even more so for frequencies above 250 MHz or 500 MHz), a significant phase shift may occur because of the delay between the locations where the offending and compensating crosstalk are injected, and because of this phase shift, the compensating crosstalk will not completely cancel out the offending crosstalk.

In an effort to address this problem caused by the delay, the aforementioned '358 patent teaches methods of using multi-stage crosstalk compensation in communications jacks that may, theoretically, completely cancel out an offending crosstalk signal having a specific frequency. However, since the frequency of the communications signals that traverse a plug-jack connection are typically not known in advance, the techniques of the '358 patent may provide good, but not perfect, crosstalk cancellation at other frequencies. Moreover, because of the aforementioned phase shifts, all other things being equal, better crosstalk performance can typically be achieved the less offending crosstalk that is generated and the closer in time the compensating crosstalk is injected to point where the offending crosstalk is injected.

As is known to those of skill in the art, crosstalk compensation circuits are typically implemented in communications jacks as capacitive crosstalk compensation circuits and as inductive crosstalk compensation circuits. Capacitive crosstalk compensation circuits are most typically implemented as plate capacitors and/or as interdigitated finger capacitors that are implemented, for example, on a printed circuit board of the jack or in the jackwire contacts of the jack, although other capacitive crosstalk compensation circuits may be used. Inductive crosstalk compensation circuits are most typically implemented as conductive paths that run side-by-side next to each other, either in the jackwire contacts or as conductive traces on a printed circuit board of the jack. Typically, it is desirable to implement the crosstalk compensation scheme using both inductive crosstalk compensation circuits and capacitive crosstalk compensation circuits so that both NEXT and FEXT can be cancelled.

In particular, it is known that in conventional modular communication plugs and jacks capacitively coupled and inductively coupled signal components add for NEXT, while they subtract for FEXT. That is:

$$NEXT = X_C + X_M$$

and $$FEXT = X_C - X_M$$

where $X_C$ is the capacitively coupled component and $X_M$ is the inductively coupled component. Here, $X_C$ may be viewed as the capacitive component of the offending crosstalk and $X_M$ may be viewed as the inductive component of the offending crosstalk. Thus, to cancel both NEXT and FEXT, a communications jack should inject compensating crosstalk that substantially cancels both the offending NEXT and the offending FEXT.

It is also known that NEXT cancellation may generally be improved by limiting the amount of delay between the offending crosstalk and the compensating crosstalk. By placing capacitive compensation at the plug-jack mating point (or very close thereto in terms of delay, such as at the non signal current-carrying end of the jackwire contacts) it may be possible to provide very high levels of NEXT cancellation, even with respect to high frequency signals. However, such a jack design may exhibit poor FEXT cancellation as the compensation being provided is totally capacitive in nature. As is apparent from the equations above, in order to substantially cancel both NEXT and FEXT, some amount of inductive compensating crosstalk is generally required if the offending crosstalk includes an inductive component $X_M$ (which it generally does due to the requirements of various industry standard documents).

The communications jacks according to embodiments of the present invention may include a variety of features that either reduce the amount of crosstalk that is injected in the plug-jack mating region, or that facilitate the injection of compensating crosstalk at a very small delay. These communications jacks may also include features that facilitate providing good cancellation of both NEXT and FEXT, and/or which may provide improved return loss performance. Various such features will now be explained with respect to the embodiment of FIGS. 3-9 and with respect to various modified embodiments that are discussed with respect to the remaining figures.

Turning first to FIG. 8, as one example, capacitive crosstalk compensation circuits such as circuits 178-1, 178-2 are provided in the front portion 131 of the flexible printed circuit board 130. Notably, these capacitive crosstalk compensation circuits 178-1, 178-2 are attached to the first ends 142 of the jackwire contacts, and hence are not on the signal current carrying path through the jack 100 (as a signal injected from a plug blade onto a jackwire contact 140 will travel from the plug contact region of the jackwire contacts 140 to the second end 146 of the jackwire contact 140 and then across traces on the flexible printed circuit board 130 to the corresponding output terminal 170). Since the crosstalk compensation circuits 178-1, 178-2 are attached to the non-signal current carrying ends of the jackwire contacts 140, they inject that capacitive crosstalk compensation at a very small delay from the plug-jack mating point. While the embodiment depicted in FIG. 8 only shows capacitive crosstalk compensation circuits 178 attached between pairs 1 and 3, it will be appreciated that additional crosstalk compensation circuits may be provided between other pair combinations in further embodiments.

The jack 100 is also designed to inject inductive crosstalk compensation at a short delay from the plug jack mating point. The inductive crosstalk compensation is provided in the jack 100 by the inductive crosstalk compensation circuits 178-3, 178-4, each of which are formed by running two of the conductive traces on the flexible printed circuit board close to each other so that the traces inductively couple. In order to inject this inductive crosstalk compensation at a relatively small delay, the inductive crosstalk compensation circuits may be implemented in the flexible printed circuit board 130 very close to the second ends 146 of the jackwire contacts 140 (i.e., as soon as possible to the points where the signals enter the flexible printed circuit board 130 from the jackwire contacts 140). However, as is shown in FIGS. 4 and 8, the longitudinal slots 137 that are provided between the fingers 138 may be relatively long. As such, the shortest path distance along the flexible printed circuit board 130 between two of the metal-plated holes 139 that receive the second ends 146 of two of the jackwire contacts 140 may be fairly long. For example, as an extended longitudinal slot 137-1 separates fingers 138-1 and 138-2, and, as a result, the longitudinal slots 137 may make it difficult to quickly provide inductive crosstalk compensation on the flexible printed circuit board 130 since such inductive compensation is typically implemented by running two conductive traces side-by-side on the printed circuit board so that they inductively couple, and the slots 137 may force a designer to implement such inductive crosstalk compensation at a greater distance, and hence a greater delay, from the jackwire contacts 140. As noted above, crosstalk compensation may be more effective if it may be injected close to the plug-jack mating point, and hence this delay in the injection of the inductive crosstalk compensation may make it more difficult to effectively cancel the crosstalk.

In order to shorten this delay, the second ends 146 of two (or more) of the jackwire contacts 140 may be co-mounted on the same finger 138. In particular, as shown in FIGS. 4 and 8, the second ends 146 of jackwire contacts 140-3 and 140-5 are both located on finger 138-3, and the second ends of jackwire contacts 140-4 and 140-6 are both located on finger 138-4. This arrangement can significantly reduce the shortest path distance the signal needs to travel before inductive coupling can be commenced. For example, as shown in FIG. 8, the shortest path distance the signal needs to travel to implement inductive coupling 178-4 can be considerably less than would have been the case had the metal plated apertures 139-11 and 139-13 been mounted on separate fingers similarly configured to fingers 138-1 and 138-2. The same is true with respect to metal-plated holes 139-12 and 139-14, because their corresponding jackwire contacts 140-4 and 140-6 are also co-located on the same finger 138-4.

As shown on FIG. 8, the conductive traces 174-3 and 174-5 that are connected to the metal-plated apertures 139-11 and 139-13 include an inductive coupling section 178-4 that provides inductive crosstalk compensation between pairs 1 and 3. Likewise, the conductive traces 174-4 and 174-6 that are connected to the metal-plated apertures 139-12 and 139-14 include an inductive coupling section 178-3 that also provides inductive crosstalk compensation between pairs 1 and 3. The inductive coupling sections 178-3, 178-4 are each located a very short distance, and hence a short delay, from the jackwire contacts 140, and thus may provide more effective crosstalk compensation.

The design of the jackwire contacts 140 may also improve the crosstalk performance of the jack 100. Most conventional RJ-45 communications jacks implement the plug contacts using spring jackwires that are elongated contact wires that are formed of beryllium-copper or phosphor-bronze. These contact wires may be formed to be sufficiently resilient such that the plug contact will meet industry standardized specifications with respect to the contact force that each jackwire contact applies to a mating plug blade and/or to ensure that the jackwire contacts do not become permanently deformed with use. Typically, relatively long jackwire contacts must be used in order to ensure that the jackwire contacts provide the requisite contact force. In contrast, the jackwire contacts 140 that may be included in communications jacks according to embodiments of the present invention may be significantly shorter, and thus the signal current carrying path through each of the jackwire contacts 140 may be very short in length. In particular, the signal current carrying path through each jackwire contact 140 extends from the middle region 144 of the jackwire contact 140 (i.e., the part of the jackwire contact that engages a mating plug blade) to the second end 146 of the jackwire contact 140. In some embodiments, the length of each jackwire contact 140 may be between about 200 mils and about 230 mils, which is far less than the length of most conventional spring jackwire contacts. As a result, the coupling, and hence the crosstalk, between adjacent jackwire contacts 140 may be significantly reduced.

Additionally, the jackwire contacts 140 may be aligned in two staggered rows in the transverse direction. This stagger may readily be seen in the perspective view of communications insert 120 provided in FIG. 4 and in the plan view of the flexible printed circuit board 130 of FIG. 8 (which shows the mounting vias for the jackwire contacts 140). As shown in FIG. 6, the jackwire contacts 140 are designed so that each contact 140 engages the bottom, longitudinal surface of a mating plug blade. Pursuant to various industry standards, an RJ-45 plug must include eight slots that extend from a lower portion of the front face of the plug housing and along the forward portion of the bottom face of the plug housing. Likewise, each blade of the RJ-45 plug must have a front region that is exposed through the portion of the slot that is in the front face of the plug housing, a bottom region that is exposed through the portion of the slot that is in the bottom face of the plug housing, and a curved transition region that connects the front and bottom regions of the plug blade.

Conventionally, jackwire contacts on an RJ-45 jack are generally designed to engage the curved transition region of their respective blades of an RJ-45 plug when the plug is fully received within the plug aperture of the jack. As a result, even if the jackwire contacts have a degree of stagger when in their resting position, when the jackwire contacts are engaged by the blades of a mating plug that is received within the plug aperture of the jack, the jackwire contacts tend to become aligned in a row as they each press against the curved transition region of their mating plug blades. By designing the jackwire contacts 140 to engage the bottom, longitudinal surface of their mating plug blades, the stagger in the jackwire contacts 140 that is present when the jackwire contacts 140 are in their normal resting positions (see FIGS. 4 and 8) may be maintained even when a plug is received within the plug aperture 114 of the jack 100, as is shown in FIG. 6.

Figure 2:
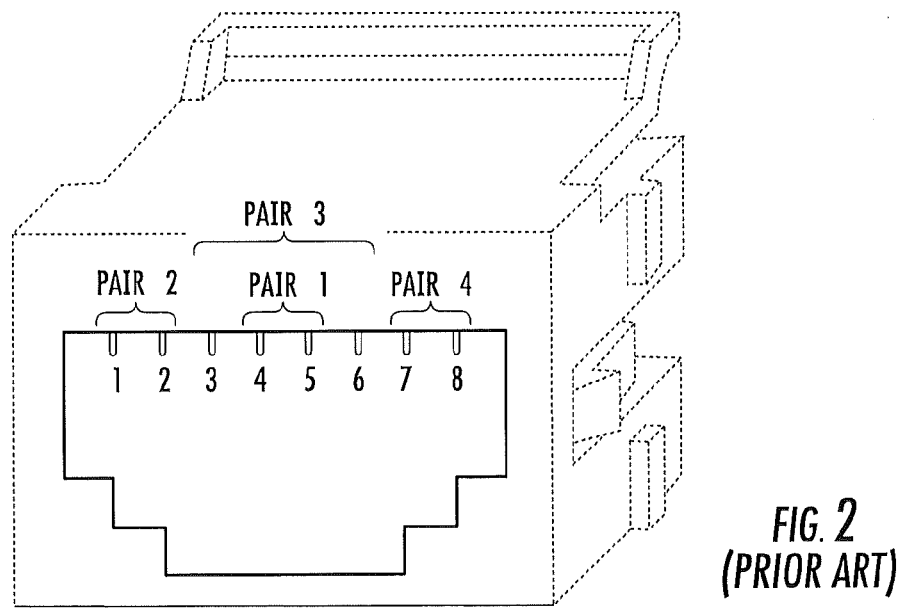
FIG. 2 is a schematic diagram illustrating the TIA 568 type B modular jack contact wiring assignments for a conventional 8-position communications jack as viewed from the front opening of the jack.

By aligning the jackwire contacts 140 so that they will stay in two staggered rows even when a plug is received within the plug aperture 114 of jack 100, it is possible to further reduce the amount of offending crosstalk that is generated between the differential pairs. By way of example, in a conventional RJ-45 jack illustrated in FIG. 2, in the plug-jack mating region jackwire contact 2 (which is part of pair 2) will generally couple a greater amount of signal energy onto jackwire contact 3 (which is part of pair 3) than will jackwire contact 1 (which is the other jackwire contact of pair 2), as jackwire contact 2 is directly adjacent to jackwire contact 3, while jackwire contact 1 is positioned farther away from jackwire contact 3. Consequently, this unequal coupling by the conductors of pair 2 onto pair 3 results in offending crosstalk from pair 2 onto pair 3 (and vice versa). Referring now to FIGS. 4 and 6, it can be seen that in the jack 100 according to embodiments of the present invention jackwire contact 140-2 is staggered with respect to jackwire contacts 140-1 and 140-3 (since jackwire contact 140-2 is positioned forwardly in a first row while jackwire contacts 140-1 and 140-3 are positioned in rearwardly in a second row), the amount of coupling between jackwire contact 140-2 and 140-3 can be reduced, thereby reducing the amount of unequal coupling from the conductors of pair 2 onto jackwire contact 140-3. Similar beneficial reductions in the amount of offending crosstalk may be achieved on each adjacent pair combination. Thus, the staggering of the input contacts 140 into first and second rows may further reduce the amount of offending crosstalk generated in the jack 100.

In some embodiments, the jackwire contacts 140 may be staggered sufficiently such that the jackwire contacts of at least one pair may be "neutral" with respect to at least one other pair. Herein, two pairs of jackwire contacts are considered to be "neutral" if they do not generate any crosstalk at any point along the lengths of the jackwire contacts 140. Note that if two pairs of jackwire contacts 140 are "neutral" then any subsections of these jackwire contacts 140 will also be neutral with respect to each other, as the neutrality (i.e., the absence of any crosstalk) must be present along the entire lengths of the jackwire contacts 140 for the two pairs of jackwire contacts 140 to be considered neutral. In the embodiment depicted in FIGS. 3-9, the jackwire contacts 140 for pair 1 (140-4, 140-5) and pair 3 (140-3, 140-6) are designed to be neutral. Neutrality may also be achieved between pairs 1 and 2 and between pairs 1 and 4. Neutrality may be more difficult to achieve between pair 3 and either pair 2 or pair 4, given the split configuration of the jackwire contacts 140-3, 140-6 of pair 3.

Neutrality between differential pairs of jackwire contacts may be desirable because, generally speaking, the less offending crosstalk that is generated the better the performance of the jack, given the difficulty of perfectly cancelling offending crosstalk. If the jackwire contacts are neutral, then no additional offending crosstalk is generated in the leadframe, and the jack may only need to compensate for the offending crosstalk that is generated in the plug as specified in the relevant industry standards documents. This may result in improved crosstalk performance. While the jack 100 provides for neutrality between pairs 1 and 3 by aligning the plug contact regions of the jackwire contacts in two transverse rows, it will be appreciated that in other embodiments the plug contact regions of the contacts may be aligned in, for example, more than two rows. It will also be appreciated that while neutrality provides certain benefits, jacks may be provided that do not achieve neutrality in the leadframe between some pairs (or even between any pairs). However, by using a stagger or other techniques to reduce the amount of offending crosstalk that is generated in the leadframe improved crosstalk performance may be achieved.

In some embodiments, the staggered jackwire contacts may be designed to not only be neutral, but to in fact generate compensating crosstalk between one or more of the pairs. This may be accomplished by exaggerating the stagger, in a variety of ways, in order to reduce the offending crosstalk between adjacent jackwire contacts to a level that is lower than the compensating crosstalk generated between the one-over jackwire contacts. In some embodiments, horizontal and/or vertical staggers may be provided between adjacent jackwire contacts that are sufficient that the jackwire contacts couple more heavily with a "one-over" jackwire contact than they do with an adjacent jackwire contact. Thus, in these embodiments, compensating crosstalk may be generated at a small delay from the plug contact regions of the jackwire contacts by generating at least some of the compensating crosstalk in the leadframe. Typically, capacitive compensating crosstalk may readily be injected at a small delay by connecting capacitors to non-signal current carrying ends of the jackwire contacts. However, inductive compensating crosstalk is often injected only after signals are routed onto a printed circuit board of the jack, and hence may be at a larger delay. The staggered jackwire contacts according to embodiments of the present invention may be designed to inject inductive compensating crosstalk within the leadframe, and hence may inject such compensating crosstalk at shorter delays, which may improve the crosstalk cancellation performance of the jack.

As shown best in FIG. 6, in some embodiments, the staggered jackwire contacts 140 may be designed to engage the bottom (longitudinal) surface of the respective blades of a mating plug as opposed to the curved transition sections of the plug blades that connect the front surface and bottom surface of each plug blade. As a result, the stagger in the jackwire contacts 140 may be maintained even when a plug is fully received within the plug aperture of the jack. In some embodiments, four jackwire contacts 140 may generally be aligned in a first transverse row and the other four jackwire contacts are aligned in a second transverse row. In some embodiments, the first transverse row may be at least about 20 mils forward of the second transverse row. In other embodiments, the first transverse row may be at least about 30 mils forward of the second transverse row. In some specific embodiments, the first transverse row may be between 20 mils and 40 mils forward of the second transverse row.

Figure 6A:
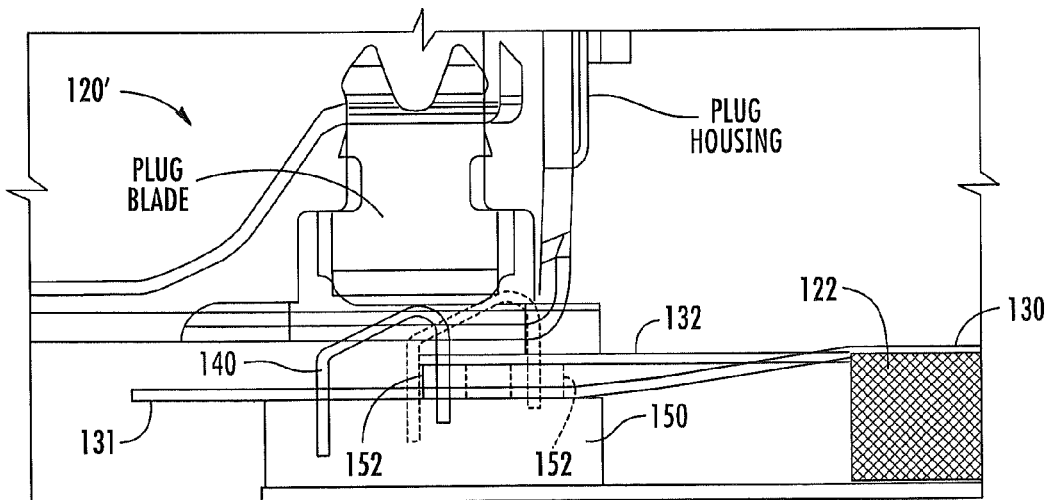
FIG. 6A is a schematic side cross-sectional view of the front portion of a modified version of the communications insert of FIG. 4 taken along the longitudinal length of one of the jackwire contacts.

FIG. 6A is a schematic side cross-sectional view of the front portion of a communications insert 120' that is a slightly modified version of the communications insert 120 of FIG. 4. The cross-sectional view of FIG. 6A is taken along the longitudinal length of one of the jackwire contacts of the communications insert 120'.

As shown on FIG. 6A, the communications insert 120' may be almost identical to the communications insert 120 that is described above, except that the rear row of jackwire contacts 140' are positioned even further rearwardly in the plug. In particular, while the two rows of jackwire contacts 140 of the communications insert 120 were spaced apart in the longitudinal direction by 30 mils, in the embodiment of FIG. 6A this separation has been increased to about 50 mils. This has at least two effects. First, the increased separation along the longitudinal (horizontal in FIG. 6A) dimension decreases the amount of offending crosstalk that is generated between adjacent jackwire contacts in the leadframe. Second, the rear row of jackwire contacts 140' now engage the plug blades along the curved transition region thereof, and hence may not be pushed downwardly as far in the vertical direction as the front row of jackwire contacts 140'. This may provide for a small vertical stagger which is provided in addition to the above-discussed horizontal stagger. This may also further decrease the amount of offending crosstalk that is injected in the leadframe.

As discussed above, in some embodiments of the present invention, capacitive crosstalk compensation may be provided in the jack 100 using crosstalk compensation circuits 178-1, 178-2 that are attached to the non-signal current carrying ends of various of the jackwire contacts, as shown in FIG. 8. These crosstalk compensation capacitors 178-1, 178-2 may inject compensating crosstalk at a very short delay from the plug-jack mating point. However, it will be appreciated that other mechanisms may be used to inject capacitive compensating crosstalk between the pairs in the jack at very short delays from the plug-jack mating point.

Figure 10:
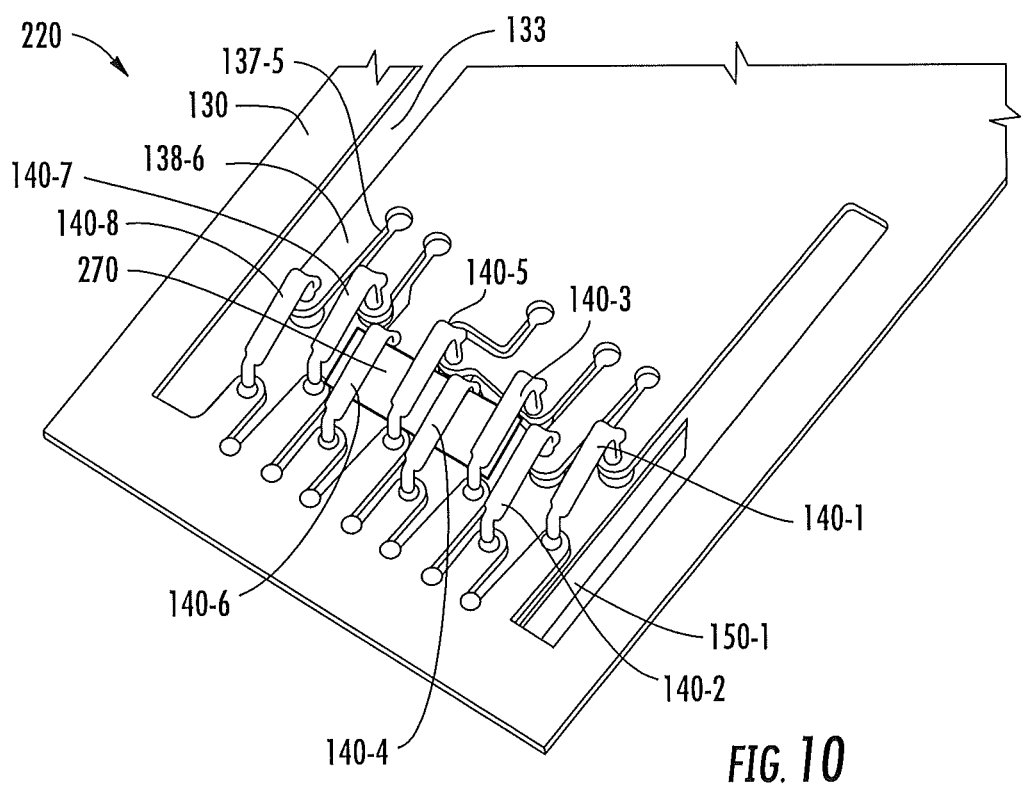
FIG. 10 is a schematic perspective view of a portion of a communications insert for a communications jack according to further embodiments of the present invention.
Figure 11:
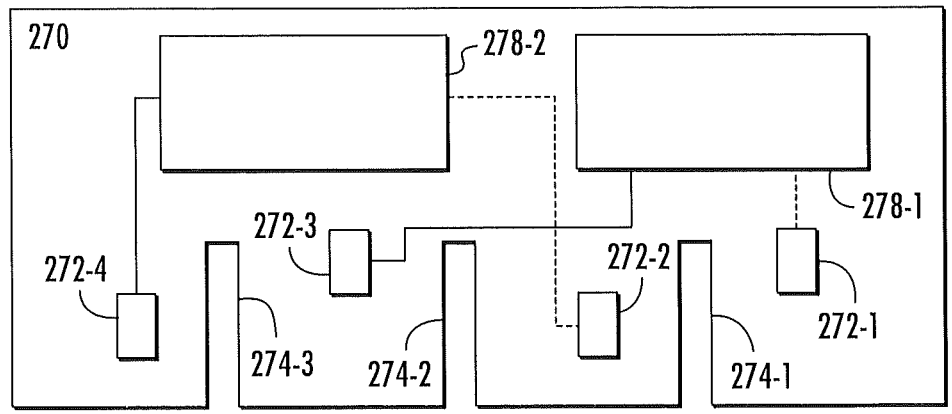
FIG. 11 is a schematic plan view of the jackwire contact mounted flexible printed circuit board of the communications insert of FIG. 10.

In particular, in some embodiments, a small printed circuit board may be mounted directly onto the middle portions of some of the jackwire contacts 140. By way of example, FIG. 10 is a schematic perspective view of a portion of a communications insert 220 for a communications jack that is very similar to the communications insert 120, but which replaces the above-discussed crosstalk compensation circuits 178-1, 178-2 with a printed circuit board 270 that is mounted on the jackwire contacts 140. FIG. 11 is a schematic plan view illustrating both the top and bottom layers of the printed circuit board 270.

As shown in FIGS. 10 and 11, the printed circuit board 270 may be mounted (e.g., by soldering or welding) to the underside of jackwire contacts 140-3 through 140-6. The printed circuit board 270 may comprise, for example, a flexible printed circuit board 270. The flexible nature of such a flexible printed circuit board 270 may allow the jackwire contacts 140-3 through 140-6 to move with some degree of independence, as may be required to ensure that each plug blade of a mating plug engages the jackwire contacts 140-3 through 140-6 with sufficient contact force.

As shown best in FIG. 11, the flexible printed circuit board 270 may include a plurality of solder pads 272-1 through 272-4. These solder pads 272 may be aligned in one or more transverse rows, and may be longitudinally aligned with the respective jackwire contacts 140-3 through 140-6. Each jackwire contact 140-3 through 140-6 may be soldered to a respective one of the solder pads 272-1 through 272-4 in order to mount the flexible printed circuit board 270 on the underside of the jackwire contacts 140-3 through 140-6 and to electrically connect each jackwire contact 140-3 through 140-6 to crosstalk compensation circuits that are provided on the flexible printed circuit board 270. In the depicted embodiment, the solder pads 272 are aligned in two transverse rows, with solder pads 272-1 and 272-3 being farther rearward than solder pads 272-2 and 272-4. This configuration allows each solder pad 272 to be positioned on the bottom side of its respective jackwire contact 140-3 through 140-6 so that it is directly opposite the plug contact region of the respective jackwire contacts 140-3 through 140-6. This may facilitate reducing or minimizing the delay between the crosstalk compensation circuits provided on the flexible printed circuit board 270 and the plug contact regions of the jackwire contacts 140-3 through 140-6. In such an embodiment, the compensating crosstalk signal may be injected onto the signal current-carrying path at a very short distance from the plug contact region on each jackwire contact 140, which distance may be as small as the thickness of the jackwire contact 140.

Still referring to FIG. 11, it can be seen that in the depicted embodiment, two crosstalk compensation circuits 278-1, 278-2 are provided on the flexible printed circuit board 270. The crosstalk compensation circuit 278-1 comprises a plate capacitor that is formed by a pair of parallel plates that are disposed on opposite sides of the flexible printed circuit board 270, where the plates are separated by the dielectric layer of the flexible printed circuit board 270. The top plate is connected to solder pad 272-1 by a conductive trace formed on the top side of the flexible printed circuit board 270 and the bottom plate is connected to solder pad 272-3 by a conductive trace formed on the bottom side of the flexible printed circuit board 270. The crosstalk compensation circuit 278-1 injects first stage capacitive compensating crosstalk between pairs 1 and 3 that has a polarity opposite the polarity of the offending crosstalk that is injected between pairs 1 and 3 in an industry standards compliant RJ-45 plug.

The crosstalk compensation circuit 278-2 similarly comprises a plate capacitor that is formed by a pair of parallel plates that are disposed on opposite sides of the flexible printed circuit board 270. The top plate of this capacitor is connected to solder pad 272-4 by a conductive trace formed on the top side of the flexible printed circuit board 270 and the bottom plate of the capacitor is connected to solder pad 272-2 by a conductive trace formed on the bottom side of the flexible printed circuit board 270. The crosstalk compensation circuit 278-2 also injects first stage capacitive compensating crosstalk between pairs 1 and 3 that has a polarity opposite the polarity of the offending crosstalk that is injected between pairs 1 and 3 in an industry standards compliant RJ-45 plug. As noted above, the crosstalk compensation circuits 278-1, 278-2 may be used to replace (or augment) the crosstalk compensation circuits 178-1, 178-2 that are provided in the jack 100 of FIGS. 3-9.

The flexible printed circuit board 270 includes a plurality of slits 274-1 through 274-3. These slits 274 define four areas on the flexible printed circuit board (namely an area that is disposed under each respective jackwire contact 140-3 through 140-6), and allow each area to bend or flex with some degree of independence from the other areas. This allows some of the jackwire contacts 140 to be depressed different distances from other of the jackwire contacts 140 without placing undue stress or force on the soldered connections between the flexible printed circuit board 270 and the jackwire contacts 140-3 through 140-6.

While the flexible printed circuit board 270 depicted in FIGS. 10 and 11 only shows capacitive crosstalk compensation circuits 278 attached between pairs 1 and 3, it will be appreciated that additional crosstalk compensation circuits may be provided between other pair combinations in further embodiments. For example, capacitive crosstalk compensation may be provided in the form of additional capacitors between pairs 2 and 3 (e.g., a capacitor on the flexible printed circuit board 270 that is connected to jackwire contacts 140-1 and 140-3) and between pairs 3 and 4 (e.g., a capacitor on the flexible printed circuit board 270 that is connected to jackwire contacts 140-6 and 140-8).

Figure 12:
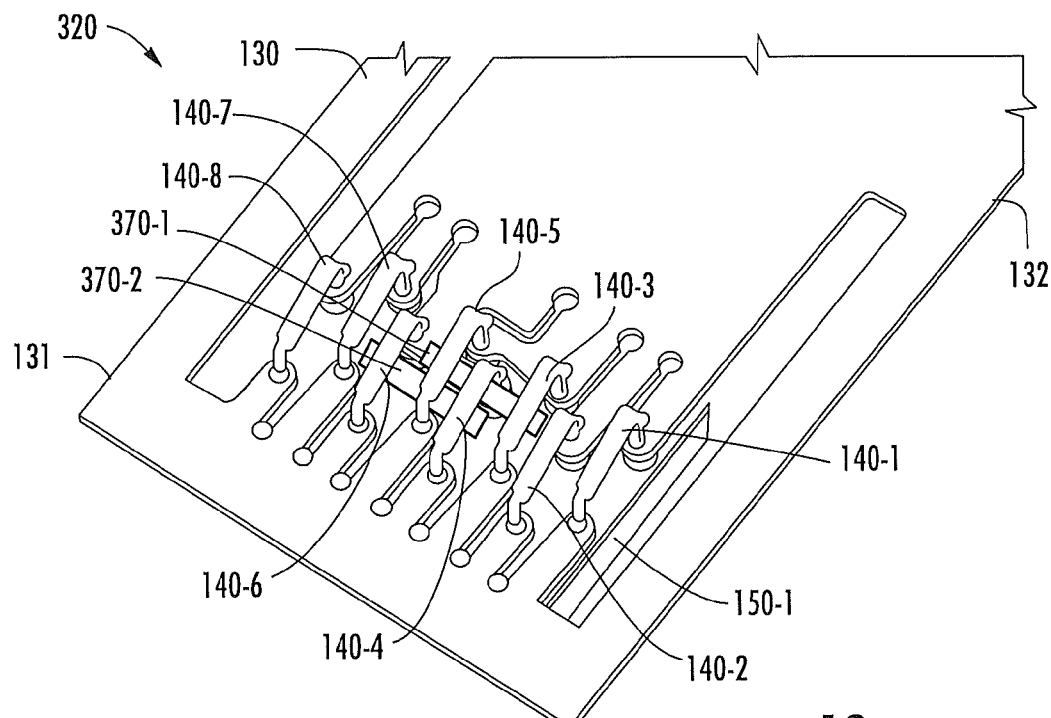
FIG. 12 is a schematic perspective view of a portion of a communications insert for a communications jack according to still further embodiments of the present invention.

FIG. 12 is a schematic perspective view of a portion of a communications insert 320 for a communications jack according to still further embodiments of the present invention. The communications insert 320 is very similar to the communications insert 220 that is discussed above with respect to FIGS. 10 and 11. However, the communications insert 320 replaces the flexible printed circuit board 270 of communications insert 220 with a pair of flexible printed circuit boards 370-1, 370-2 that are mounted (e.g., by soldering or welding) to the underside of jackwire contacts 140-3 through 140-6.

The flexible printed circuit boards 370-1 and 370-2 may each contain a crosstalk compensation circuit. For example, the flexible printed circuit board 370-1 may be mounted (e.g., by soldering or welding) to the underside of jackwire contacts 140-3 and 140-5 and may include the crosstalk compensation capacitor 278-1 (see FIG. 11). The flexible printed circuit board 370-2 may be mounted (e.g., by soldering or welding) to the underside of jackwire contacts 140-4 and 140-6 and may include the crosstalk compensation capacitor 278-2 (see FIG. 11). Each flexible printed circuit board 370-1, 370-2 may include a slit (not shown) that are similar to the slits 274 of flexible printed circuit board 270. By replacing the single flexible printed circuit board 270 of FIGS. 10 and 11 with the two flexible printed circuit boards 370-1, 370-2 that are depicted in FIG. 12 it may be possible to reduce unintended coupling between the crosstalk compensation circuits and it may also be possible to allow for more independence of movement between the jackwire contacts 140-3 through 140-6 (since each jackwire contact 140 is only connected at most to one other jackwire contact 140 via the jackwire contact mounted printed circuit boards 370 and because the slits in the flexible printed circuit boards 370-1, 370-2 may be positioned farther away from the solder pads.

Figure 13:
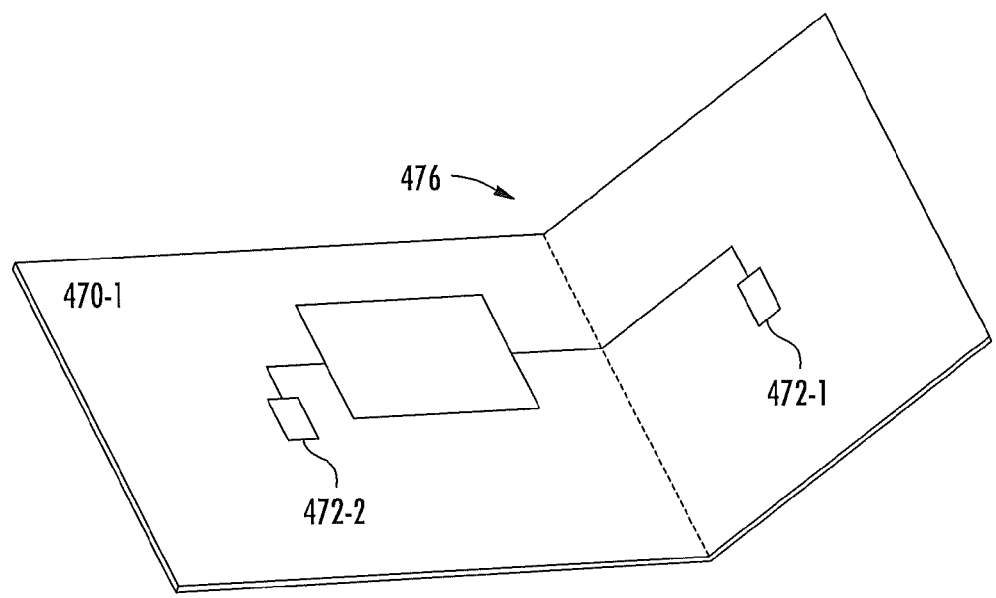
FIG. 13 is a schematic perspective view of a portion of a communications insert for a communications jack according to yet additional embodiments of the present invention.

FIG. 13 is a schematic perspective view of a flexible printed circuit board 470-1 that may be used instead of the flexible printed circuit board 370-1 that is depicted in FIG. 12. The flexible printed circuit board 470-1 may be very similar to the flexible printed circuit board 370-1 except that the flexible printed circuit board 470-1 includes a bend or crease 476 (herein bends or creases are generically referred to as a "fold"). The flexible printed circuit board 470-1 may, for example, be soldered (via solder pads 472-1, 472-2) to jackwire contacts 140-3 and 140-5, respectively. The fold 476 allows the jackwire contacts 140-3 and 140-5 to freely move different amounts in response to the insertion of a communications plug into the plug aperture 114 of the jack 100, as the fold 476 may crease more or less heavily, as necessary, in response to such non-uniform movement of the jackwire contacts 140-3, 140-5. The provision of one or more folds 476 may eliminate any need for the slits 274 that are provided on flexible printed circuit board 270, as the fold(s) 476 and the slits 274 may serve the same purpose. However, in some embodiments, both folds and slits may be provided on the same jackwire contact 140 mounted flexible printed circuit board to further increase the ability of the jackwire contacts 140 that the flexible printed circuit board is mounted on to move independently.

Thus, pursuant to embodiments of the present invention, communications jacks are provided that have a housing, a printed circuit board that is at least partially mounted within the housing, and a plurality of jackwire contacts. Each jackwire contact has a base portion that is mounted in the printed circuit board and a plug blade contact surface. A flexible printed circuit board is mounted on at least two of the jackwire contacts and includes at least one crosstalk compensation circuit. The plug blade contact surfaces of some of the jackwire contacts may be aligned in a first transverse row, and others of the jackwire contacts may be aligned in a second transverse row that is offset from the first transverse row. In some embodiments, the printed circuit board that receives the base ends of the jackwire contacts may be a flexible printed circuit board. A mounting substrate may be provided underneath the flexible printed circuit board so that the jackwire contacts are mounted through the flexible printed circuit board and into the mounting substrate (and hence the jackwire contacts are mounted in both the flexible printed circuit board and in the mounting substrate). The jack may be an RJ-45 jack, and the flexible printed circuit board may include crosstalk compensation circuits that inject compensating crosstalk between pairs 1 and 3.

Figure 11A:
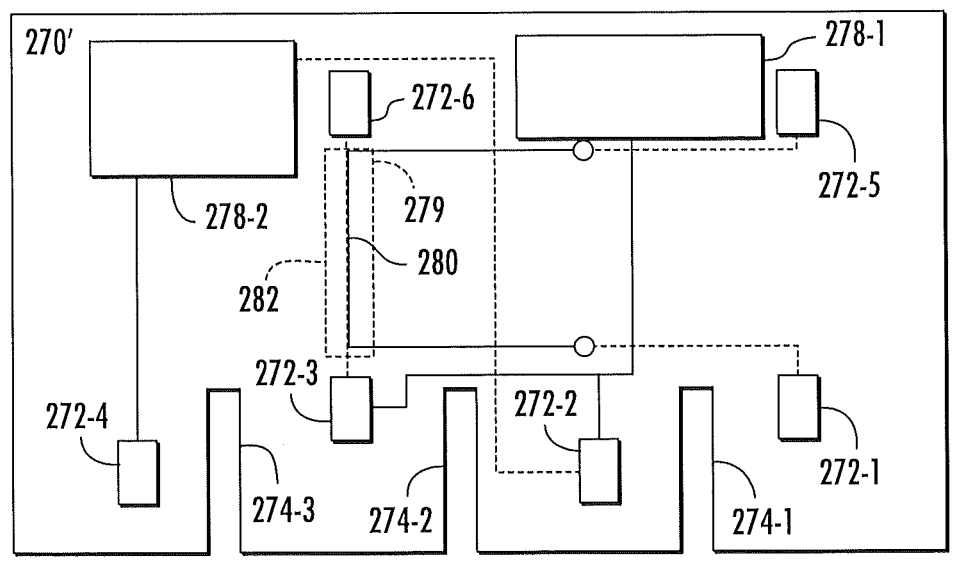
FIG. 11A is a schematic plan view of a modified version of the flexible printed circuit board of FIG. 11.

As shown in FIG. 11A, in further embodiments of the present invention, a jackwire contact mounted flexible printed circuit board 270' may be provided that includes both capacitive and inductive compensating crosstalk circuits. The flexible printed circuit board 270' is similar to the flexible printed circuit board 270 shown in FIGS. 10 and 11, and may be used in place of the flexible printed circuit board 270. The flexible printed circuit board 270' includes six solder pads 272, namely, the four solder pads 272-1 through 272-4 that are discussed above as well as two additional solder pads 272-5 and 272-6. Solder pads 272-5 and 272-6 are longitudinally aligned with solder pads 272-1 and 272-3, respectively. Jackwire contact 140-3 is mechanically and electrically connected to both solder pads 272-1 and 272-5, jackwire contact 140-4 is mechanically and electrically connected to solder pad 272-3, jackwire contact 140-5 is mechanically and electrically connected to both solder pads 272-3 and 272-7, and jackwire contact 140-6 is mechanically and electrically connected to solder pad 272-4.

As shown in FIG. 11A, the flexible printed circuit board includes the capacitive crosstalk compensation circuits 278-1, 278-2 that are discussed above with respect to FIG. 11. In addition, the flexible printed circuit board 270' includes an inductive crosstalk compensation circuit 279. The inductive crosstalk compensation circuit 279 is formed by running a first trace 280 from solder pad 272-1 on the top side of flexible printed circuit board 270' to generally extend between pads 272-3 and 272-6. The first trace 280 then runs transversely to attach to solder pad 272-5. A second trace 282 is run on the bottom side of flexible printed circuit board 270' from solder pad 272-3 to solder pad 272-6, and hence runs directly or almost directly below a portion of the first trace 280. A portion of the signal current on jackwire contact 140-3 will be routed onto the first trace 280 (i.e., a signal injected onto contact 140-3 will be split, with a first portion of the signal traversing the jackwire contact 140-3 and a second portion of the signal passing through solder pad 272-1, trace 280 and solder pad 272-5 and then back onto the jackwire contact 140-3). Likewise, a portion of the signal current on jackwire contact 140-5 will be routed onto the second trace 282 in a similar fashion. The signals traversing the first and second traces 280, 282 will inductively couple to provide inductive compensating crosstalk, thereby forming the inductive crosstalk compensation circuit 279.

Figure 14:
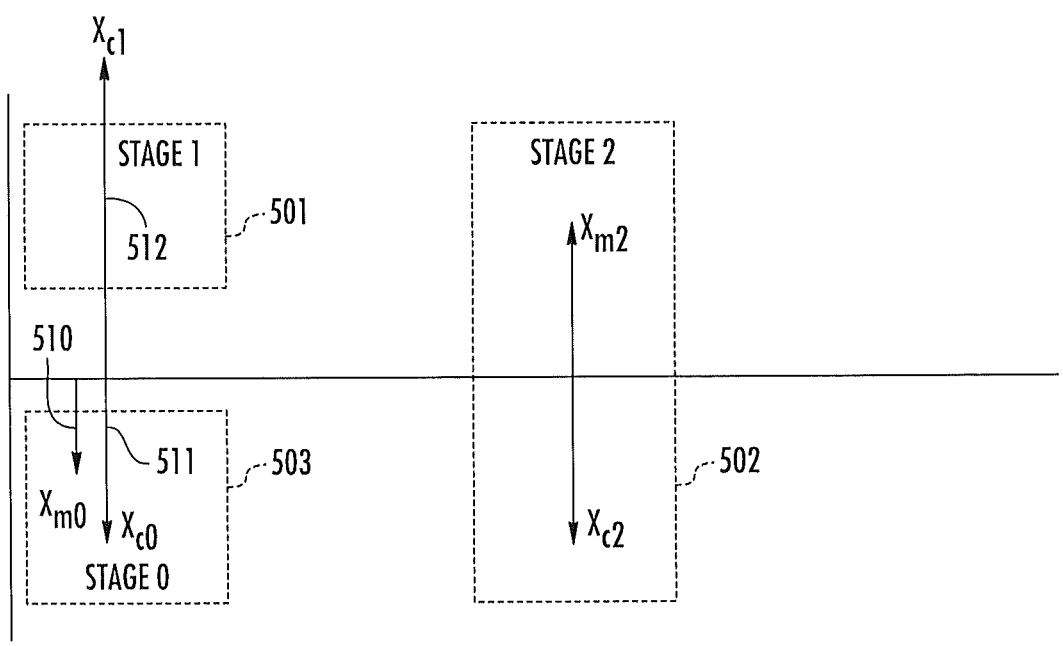
FIG. 14 is a vector diagram illustrating a crosstalk compensation scheme for cancelling both NEXT and FEXT according to embodiments of the present invention.

Pursuant to further embodiments of the present invention, communications jacks are provided that can very effectively cancel both NEXT and FEXT. In particular, U.S. Pat. No. 6,464,541 ("the '541 patent"), issued Oct. 15, 2002, sets forth techniques where first stage compensating crosstalk that is injected at a small delay may be used to cancel NEXT, and a second stage of compensating crosstalk which includes equal but opposite amounts of inductive and capacitive crosstalk may be used to adjust the relative amounts of inductive and capacitive crosstalk compensation in order to improve the FEXT cancellation of the jack. Pursuant to embodiments of the present invention, the concepts of the '541 patent may be modified and implemented on a flexible printed circuit board in a manner that can provide very effective crosstalk cancellation. FIG. 14 is a vector diagram illustrating such a crosstalk compensation scheme for cancelling both NEXT and FEXT according to embodiments of the present invention that may be used, for example, in a communications jack.

As shown in FIG. 14, two stages 501, 502 of crosstalk compensation are provided within an RJ-45 communications jack 500 that may be used to cancel offending crosstalk 503. As discussed above, a mating connector in the form of an industry standards compliant RJ-45 communication plug will introduce offending crosstalk between various of the differential pairs. The vectors 510 and 511 represent the offending crosstalk that is introduced between pairs 1 and 3 in the mating communications plug. This offending crosstalk includes inductive offending crosstalk and capacitive offending crosstalk. The offending crosstalk between pairs 1 and 3 is generated in the plug by coupling between plug blades 3 and 4 and between plug blades 5 and 6. In FIG. 14, vector 510 represents the inductive component Xmo of the offending crosstalk generated in the plug between pairs 1 and 3 in the plug 505 and the vector 511 represents the capacitive component Xco of the offending crosstalk generated in the plug between pairs 1 and 3. Typically, the capacitive component Xco follows the inductive component Xmo after only a relatively short delay, although the relative positions of vectors 510 and 511 may vary depending on the design of the plug.

As shown in FIG. 14, capacitive crosstalk compensation Xc1 (vector 512) that has a magnitude that is the same or approximately equal to Xco+Xmo and which has opposite polarity, is introduced in a first stage 501 (Stage 1) of crosstalk compensation. The capacitive crosstalk compensation Xc1 may be injected between pairs 1 and 3 at a point that is very close in time to the point in time where the offending crosstalk is injected. For example, as shown in FIG. 14, the capacitive crosstalk compensation Xc1 may be injected at approximately the same point in time as the offending capacitive crosstalk Xc0. Since the capacitive crosstalk compensation Xc1 is injected by the first stage 501 at a minimal delay and has a magnitude equal to the sum of the magnitudes of the inductive and capacitive offending crosstalk (with opposite polarity), a high degree of NEXT cancellation may be achieved.

To cancel FEXT without degrading NEXT, the second stage 502 of crosstalk compensation is provided, as shown in FIG. 14. The second stage 502 includes an inductive crosstalk compensation component Xm2 and a capacitive crosstalk compensation component Xc2 that is equal in magnitude and of opposite polarity to the inductive component Xm2 Thus, the capacitive crosstalk component Xc2 has the same polarity as the offending crosstalk that is injected in stage 0. Both Xm2 and Xc2 may have the same magnitude as the inductive component of the offending crosstalk Xm0. The capacitive coupling component Xc2 and the inductive compensation component Xm2 may be injected at the same time to be substantially self-cancelling.

As can be seen in FIG. 14 that the second stage 502 produces the required capacitive-for-capacitive and inductive-for-inductive compensations needed to cancel FEXT. Although the first and the second stages 501, 502 are delayed from one another, FEXT cancellation is substantially delay insensitive and may not be significantly affected. Also, the second stage 502 is self-canceling, and can be conveniently positioned in time or distance with respect to the first stage 501, without degrading NEXT performance.

Accordingly, to compensate for both NEXT and FEXT simultaneously, the capacitive component Xco of the offending crosstalk is effectively canceled by capacitively coupled crosstalk of equal magnitude and opposite polarity, and the offending inductive component Xmo is effectively canceled by inductively induced crosstalk of equal magnitude and opposite polarity.

In further embodiments, the crosstalk compensation scheme of FIG. 14 could be modified so that the Xm2 component of second stage 502 is moved toward the left slightly (i.e., closer to the plug-jack mating point) to provide even more effective cancellation of NEXT. In this embodiment, the residual crosstalk that is provided because of the imperfect crosstalk cancellation in the second stage 502 may be used to cancel residual crosstalk that exists because the first stage 501 fails to completely cancel the offending crosstalk generated in the plug (i.e., vectors 510 and 511). In one example implementation of this embodiment, an RJ-45 jack (T-568B) may include a first crosstalk compensation stage that is configured to cancel crosstalk introduced between the first and third differential pairs of conductive paths in a mating RJ-45 plug and any crosstalk injected between the first and third differential pairs of conductive paths at the plug-jack interface. The jack may further include a second crosstalk compensation stage that comprises at least an inductive coupling section between either the third conductive path and the fourth conductive path or between the fifth conductive path and the sixth conductive path. The jack may also have a third crosstalk compensation stage that comprises at least a first capacitor that is coupled between either the third conductive path and the fourth conductive path or between the fifth conductive path and the sixth conductive path. The first capacitor may be a distributed capacitor that injects capacitance at multiple locations between the first and third differential pairs of conductive paths. The second and third compensating stages may have substantially equal but opposite magnitudes. Moreover, a weighted mid-point of the second crosstalk compensation stage may be positioned between a weighted mid-point of the first crosstalk compensation stage and a weighted mid-point of the third crosstalk compensation stage. Herein, the "weighted mid-point" of a crosstalk compensation stage refers to the point along each conductive path where the same amount of crosstalk is injected by the crosstalk compensation stage on either side of the point. Typically, the weighted mid-point of the second compensation stage will be closer to the weighted mid-point of the third compensation stage that to the weighted mid-point of the first compensation stage.

The aforementioned '541 patent teaches using a leadframe design that has a first portion where additional offending crosstalk is injected (the portion where the jackwire contacts are all aligned in a row) and a second portion which is made to be neutral. The first stage crosstalk compensation is introduced using capacitors that are disposed on an auxiliary printed circuit board that electrically connects to the distal ends of the jackwire contacts. The inductive component of the second stage crosstalk compensation is implemented as two pairs of inductively coupling traces on the main printed circuit board (which couple between contacts 3 and 5 and between contacts 4 and 6) and the capacitive component of the second stage crosstalk compensation is implemented as two interdigitated capacitors on the main printed circuit board (which couple between contacts 3 and 4 and between contacts 5 and 6). These interdigitated capacitors are attached at the midpoints of the respective pairs of coupling traces that inject the second stage inductive crosstalk compensation.

The design disclosed in the '541 patent may provide good crosstalk compensation, but may not be ideal for certain high frequency applications. For example, as noted above, the leadframe includes a section where significant offending crosstalk may be generated. Thus, it may be necessary to not only cancel the offending crosstalk that is generated in the plug, but also the additional offending crosstalk that is generated in the leadframe. Additionally, in the second stage, the capacitive crosstalk is injected using lumped elements (interdigitated finger capacitors). While these interdigitated finger capacitors are positioned at the mid-point of the inductive crosstalk compensation, the capacitive crosstalk compensation will all be injected at a single point, while the inductive crosstalk will be injected over time. As a result, the inductive and capacitive crosstalk cancellation in the second stage will not be perfect over an extended frequency range.

Pursuant to embodiments of the present invention, superior crosstalk cancellation may be achieved by modifying the implementation disclosed in the '541 patent. As discussed above with respect to the jack 100 of FIGS. 3-9, the jackwire contacts 140 may be staggered with respect to each other so that the jackwire contacts may be neutral, at least for some of the pair combinations (specifically including the pair 1 and pair 3 combination that has the most crosstalk). Thus, the jacks according to embodiments of the present invention may only need to cancel the offending crosstalk that is injected in the plug, at least for some pair combinations.

Additionally, the second stage compensation is injected on the flexible printed circuit board. As discussed above, the dielectric layer in a flexible printed circuit board may be much, much thinner than the dielectric layer on a conventional printed circuit board (e.g., twenty times as thin). As such, if inductively coupling traces are arranged on opposed sides of the dielectric layer of a flexible printed circuit board (in contrast to the side-by-side coupling traces on a conventional printed circuit board in the embodiment of the '541 patent), much higher levels of inductive crosstalk may be generated per unit length of inductively coupling traces. As such, even if lumped element capacitors are used in the second stage, the inductive and capacitive components of the second stage compensation may be more closely matched in time, and hence will be closer to being self-cancelling.

Furthermore, pursuant to some embodiments of the present invention, the second stage compensation may be implemented as coupling traces on opposite sides of a flexible printed circuit board that couple both inductively and capacitively. In order to have the capacitive and inductive crosstalk have opposite polarities (as is necessary for a self-cancelling second stage), the tip conductor or one pair (e.g., conductor 3) is designed to couple with a ring conductor of the other pair (e.g., conductor 4). This will introduce capacitive crosstalk having the same polarity as the offending crosstalk. However, in order to generate inductive crosstalk having the opposite polarity, the direction of one of the coupling traces is reversed so that, in the coupling portion, its furthest end from the plug-jack interface, in terms of current travel, couples most with the nearest end from the plug-jack interface, in terms of current travel, of the other trace and vice versa. Thus, in the above fashion, a pair of traces may be used to simultaneously inject both capacitive crosstalk and inductive crosstalk that have opposite polarities.

Moreover, the coupling may be designed so that the amount of capacitive coupling per unit length is substantially equal to the amount of inductive coupling per unit length. In particular, by controlling and/or adjusting the widths of the coupling traces and/or the degree of overlap of the inductively coupling traces, the amount of inductive and capacitive coupling per unit length may be equalized. When this is done, the inductive and capacitive coupling may be arranged to be truly self-cancelling since the amount of inductive and capacitive coupling will be equal at all points along the second stage. This may significantly improve the crosstalk performance of the connector.

Figure 15:
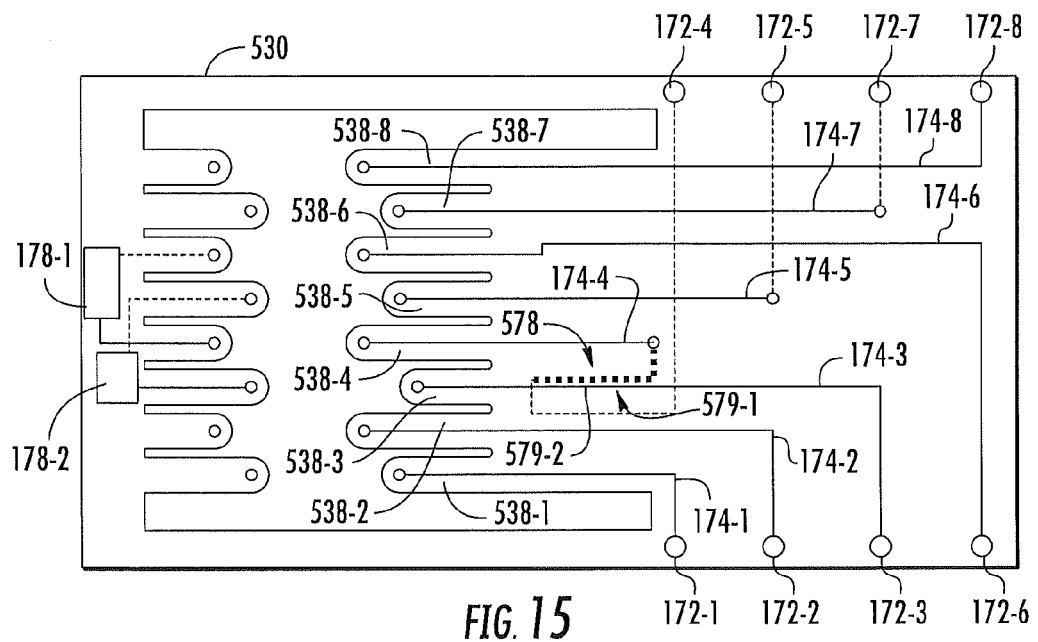
FIG. 15 is a schematic plan view of a flexible printed circuit board of a communications insert that implements the compensation scheme of FIG. 14.

FIG. 15 is a schematic plan view of a flexible printed circuit board 530 of a communications insert that implements the compensation scheme of FIG. 14. The flexible printed circuit board 530 may be very similar to the flexible printed circuit board 130 discussed above with respect to FIG. 8, and may be used in the communications jack 100 in place of the flexible printed circuit board 130.

The printed circuit board 530 may use the contacts 140 that are illustrated in FIG. 4. Thus, the leadframe may, for example, be neutral between pairs 1 and 3, thus reducing and/or minimizing the amount of crosstalk that must be compensated for in the jack 100. Additionally, the printed circuit board 530 includes the crosstalk compensation circuits 178-1, 178-2. These may be used to generate the first stage crosstalk compensation 501 discussed above with respect to FIG. 14. The crosstalk compensation circuits 178-1, 178-2 may be sized to cancel the inductive and capacitive crosstalk that is generated in a mating plug.

In addition, the printed circuit board 530 includes a second stage crosstalk compensation circuit 578. As shown in FIG. 15, the second crosstalk compensation circuit is implemented by a pair of coupling trace segments 579-1 and 579-2. The trace segment 579-1 is part of conductive path 174-4 (i.e., the conductive path that connects the base of jackwire contact 140-4 to the IDC 170-4). In particular, trace segment 579-1 is the portion of conductive path 174-4 that it is routed toward the front of the flexible printed circuit board 530 (i.e., the portion between the 180 degree turns in conductive path 174-4). As shown in FIG. 15, the trace segment 579-1 may be widened as compared to the traces used to form the remainder of conductive path 174-4. The trace segment 579-2 is part of conductive path 174-3 (i.e., the conductive path that connects the base of jackwire contact 140-3 to the IDC 170-3). Trace segment 579-2 may also be widened as compared to the traces used to form the remainder of conductive path 174-3. Trace segment 579-2 extends on the top side of the flexible printed circuit board 530 and may be directly opposite the trace 579-1 (which is on the bottom side of the flexible printed circuit board 530) so that the trace segments 579-1 and 579-2 are, for example, partially or completely overlapping when viewed from above.

As the trace segments 579-1 and 579-2 are routed on opposite sides of the flexible printed circuit board in an overlapping manner, the trace segments 579-1 and 579-2 will capacitively couple. The trace segments 579-1 and 579-2 will also inductively couple. Some or all of trace segments 579-1, 579-2 may comprise widened traces, which may increase the degree of capacitive coupling. Since the trace segments 579-1 and 579-2 are routed in opposite directions (i.e., trace segment 579-1 is routed such that its furthest end from the plug-jack interface, in terms of current travel, couples most with the nearest end from the plug jack interface, in terms of current travel, of the trace segment 579-2 and vice versa), the polarity of the inductive coupling will be opposite the polarity of the capacitive coupling, as is required for the second stage of the crosstalk compensation scheme illustrated in FIG. 14. Moreover, the widths of the overlapping portion of trace segments 579-1, 579-2 and/or the degree of overlap may be selected so that the capacitive coupling between the traces 579-1, 579-2 may be equal in magnitude (while opposite in polarity) to the inductive coupling between the traces 579-1, 579-2. This, FIG. 15 illustrates an embodiment that can, theoretically, perfectly implement the transparent second stage 502 of the crosstalk compensation scheme of FIG. 14.

Note that in the embodiment of FIG. 15, the inductive coupling sections 178-3 and 178-4 of the embodiment of FIGS. 3-9 are omitted. These inductive coupling sections 178-3 and 178-4 may be unnecessary because the inductive coupling traces 579-1, 579-2 may be used to compensate for the inductive crosstalk in a mating plug.

As can also be seen in FIG. 15, the printed circuit board 530 includes a total of eight rear fingers 538-1 through 538-8 as opposed to the six rear fingers 138-1 through 138-6 that are provided in the embodiment of FIGS. 3-9. As discussed above, the embodiment of FIG. 15 includes a second stage in which the tip conductive trace of one pair and a ring conductive trace of another pair are configured to impart inductive compensation in the amount needed to ensure perfect FEXT cancellation in the mated plug-jack combination. Thus, it is unnecessary and counter-productive to add more inductive compensation and hence the transversely disposed fingers of the embodiment of FIGS. 3-9 may be omitted, and instead only longitudinal fingers may be used, with each jackwire contact 140 having its own respective rear finger 138.

Thus, pursuant to embodiments of the present invention, communications jacks are provided that include a plurality of input contacts, a plurality of output contacts and a plurality of conductive paths that each electrically connect a respective one of the input contacts to a respective one of the output contacts, the conductive paths being arranged as a plurality of differential pairs of conductive paths. A first crosstalk compensation stage is provided between first and second of the differential pairs of conductive paths, the first crosstalk compensation stage configured to inject crosstalk having a first polarity between the first and second of the differential pairs of conductive paths. The first crosstalk compensation stage may comprise capacitive compensating crosstalk. Additionally, a second crosstalk compensation stage is provided between the first and second of the differential pairs of conductive paths, the second crosstalk compensation stage including an inductive sub-stage that is configured to inject inductive crosstalk having the first polarity between the first and second of the differential pairs of conductive paths and a capacitive sub-stage that is configured to inject capacitive crosstalk having a second polarity between the first and second of the differential pairs of conductive paths, the second polarity being opposite the first polarity. Moreover, the capacitive sub-stage may be a distributed capacitive sub-stage.

In some embodiments, the capacitive sub-stage and the inductive sub-stage may inject substantially the same amount of crosstalk as a function of time so as to be substantially self-cancelling at frequencies up to 2 GHz. The second crosstalk compensation stage may be a first trace of the first differential pair on a first side of a flexible printed circuit board and a second trace of the second differential pair on a second side of the flexible printed that at least partially overlaps the first trace. The first trace may be part of a tip conductive path and the second trace may be part of a ring conductive path. At least one of the first trace or the second trace may be a widened trace that is configured to have increased capacitive coupling with the other of the first trace or the second trace. Moreover, the widths of these traces and/or the degree of overlap of these traces may be selected such that the amounts of inductive and capacitive crosstalk injected in the second stage match.

While the example above illustrates a jack that implements the crosstalk compensation scheme of FIG. 14 between pairs 1 and 3 of an RJ-45 jack, it will be appreciated that this scheme may be used on other pair combinations. For example, the same scheme may be used with respect to pairs 1 and 2 and/or with respect to pairs 1 and 4. In such embodiments, the capacitive and inductive second stage compensation would be injected between so-called "like" conductors of the pairs at issue (i.e., between the tip conductive paths of each pair or between the ring conductive paths of each pair).

Figure 16:
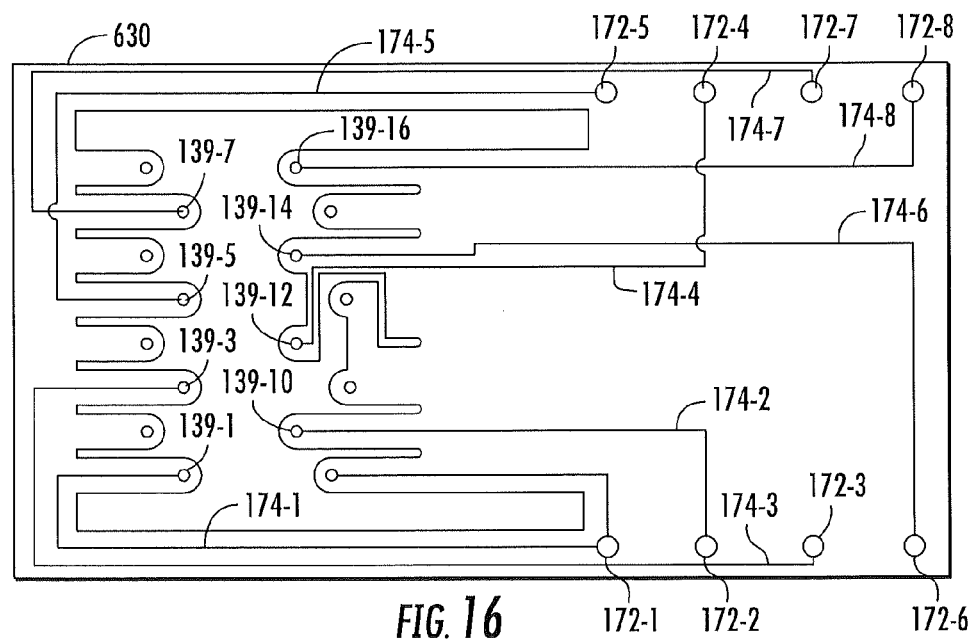
FIG. 16 is a schematic plan view of a flexible printed circuit board of a communications insert according to further embodiments of the present invention.
Figure 17:
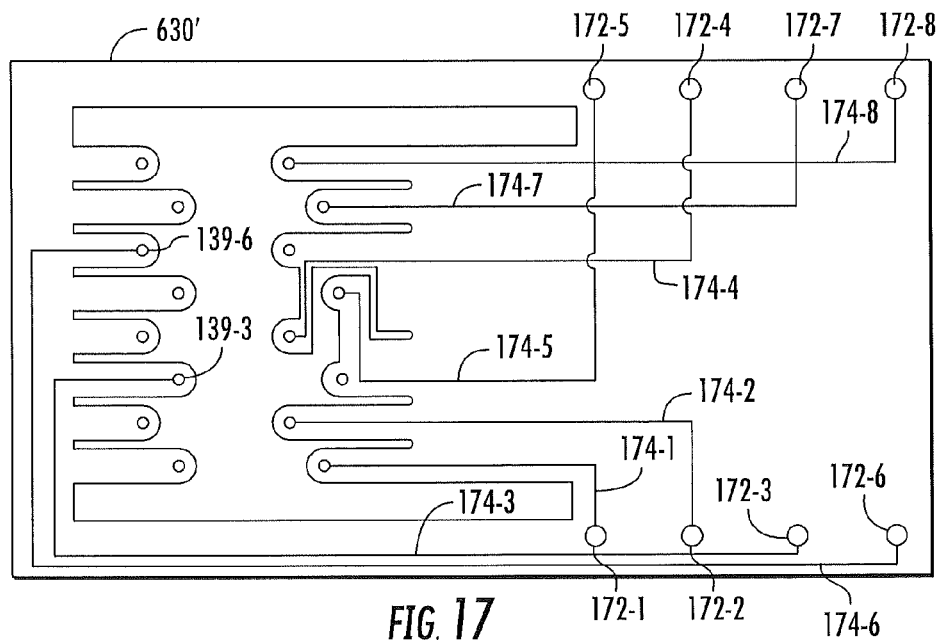
FIG. 17 is a schematic plan view of a flexible printed circuit board of a communications insert according to still further embodiments of the present invention.

Pursuant to still further embodiments of the present invention, the leadframe may be designed so that the current flow in at least some of the jackwire contacts flows in a direction that is generally opposite the direction in which the current flows in other of the jackwire contacts. FIGS. 16 and 17 are schematic plan views of flexible printed circuit boards that have leadframe designs in which the signal current flows in opposite directions.

As shown in FIG. 16, in one embodiment, a flexible printed circuit board 630 is provided that is designed so that each tip jackwire contact (i.e., jackwire contacts 140-1, 140-3, 140-5 and 140-7) may be designed so that the signal current carrying path will flow from the plug contact region through the front portion of the tip jackwire contact 140 and each ring jackwire contact (i.e., jackwire contacts 140-2, 140-4, 140-6 and 140-8) may be designed so that the signal current carrying path will flow from the plug contact region through the rear portion of the ring jackwire contact 140. This may be accomplished by connecting the traces 174-1, 174-3, 174-5 and 174-7 to the metal-plated vias 139-1, 139-3, 139-5 and 139-7, respectively that receive the front portion of the respective tip jackwire contacts 140. In this embodiment, the flexible printed circuit board 630 will typically be implemented as a single flexible printed circuit board to facilitate routing the traces 174 between the front portion of the tip jackwire contacts 140 and their respective IDCs 170. Additionally, the first stage capacitive crosstalk compensation may be implemented using a flexible printed circuit board that is mounted on the jackwire contacts (as in the embodiments depicted in FIGS. 10-13) in order to keep the first stage crosstalk compensation at a very small delay. As shown in FIG. 16, the conductive traces 174-1, 174-3, 174-5 and 174-7 may be routed along the portions of the flexible printed circuit board 630 that define the outer edges of the longitudinal slots 133.

The flexible printed circuit board 630 may be used in the communications insert 120 that is discussed above with respect to FIGS. 3-9 as a replacement for flexible printed circuit board 130. A communications insert that includes flexible printed circuit board 630 will have signal current carrying paths that flow along the tip jackwire contacts 140 toward the front of the flexible printed circuit board 630 and will have signal current carrying paths that flow along the ring jackwire contacts 140 toward the rear of the flexible printed circuit board 630. By changing the direction of the current flow through every other jackwire contact 140, the jackwire contacts 140 may be made to be compensating in that compensating crosstalk may be introduced between the pairs in the leadframe. It will be appreciated that in other embodiments the flexible printed circuit board could be designed so that the signal current would flow toward the front of the flexible printed circuit board in each ring jackwire contact 140 and toward the rear of the flexible printed circuit board in each tip jackwire contact 140.

FIG. 17 illustrates a flexible printed circuit board 630' according to yet further embodiments of the present invention. As can be seen from FIG. 17, in this embodiment the signal current carrying path through the jackwire contacts 140-3 and 140-6 of pair 3 flow toward the front of the flexible printed circuit board 630' while the signal current carrying path through the remaining six jackwire contacts 140 flow toward the rear of the flexible printed circuit board 630'. This design may achieve crosstalk neutrality between pairs 1 and 3, between pairs 2 and 3 and between pairs 3 and 4 in the leadframe. Once again, the first stage capacitive crosstalk compensation may be implemented using a flexible printed circuit board that is mounted on the jackwire contacts (as in the embodiments depicted in FIGS. 10-13) in order to keep the first stage crosstalk compensation at a very small delay.

In the flexible printed circuit board 630', the traces that run from the metal-plated vias 139 to the IDCs may be routed in pairs to form differential transmission lines on the flexible printed circuit board. For example, in the embodiment of FIG. 17, the conductive traces 174-3 and 174-6 may be run side-by-side as a pair across the flexible printed circuit board, as is depicted in the figure. However, in other embodiments, the conductive traces of some or all of the differential pairs may be run in overlapping fashion on opposite sides of the flexible printed circuit board 630'. This arrangement may improve the return loss of the differential transmission lines on the flexible printed circuit board 630'.

Pursuant to still further embodiments of the present invention, communications jacks are provided which may exhibit improved return loss on their differential transmission lines. This improved return loss may be achieved, for example, by inductively and/or capacitively self-coupling the two conductive paths of the differential transmission lines. This self-coupling may help counteract the loads placed on the differential transmission lines by the high levels of crosstalk compensation that may be necessary to counteract the offending crosstalk (particularly for high frequency signals), and hence may provide improved return loss on the transmission lines.

The above-described design may also be used to compensate for different plug penetration depths into the communications jack. In particular, as is known to those of skill in the art, when an RJ-45 plug is inserted into the plug aperture of an RJ-45 jack such that the latch on the plug locks the plug within the plug aperture, some degree of "play" will still be provided in terms of how far that the plug penetrates into the plug aperture. Thus, in practice, one may not know the exact penetration of the plugs that will be used in a given jack; instead, one will typically only know that the plug penetration depth may fall within a range specified in relevant industry standard documents. This uncertainty regarding plug penetration depth may make it more difficult to effectively cancel the offending crosstalk injected in the plug.

Pursuant to embodiments of the present invention, the compensating crosstalk that is injected in a communications jacks may be designed so that changes in the amount of compensating crosstalk that is injected between the differential pairs (e.g., between pairs 1 and 3) that result from different plug penetration depths are offset by substantially equal magnitude and opposite polarity changes in the amount of compensating crosstalk injected by the jack. In such communications jacks, the crosstalk compensation scheme may be relatively insensitive to plug penetration depth, and may therefore consistently provide better crosstalk compensation. One way of achieving this is to have the current run in different directions along the jackwire contacts of different differential pairs (e.g., differential pairs 1 and 3), as discussed above.

Figure 18:
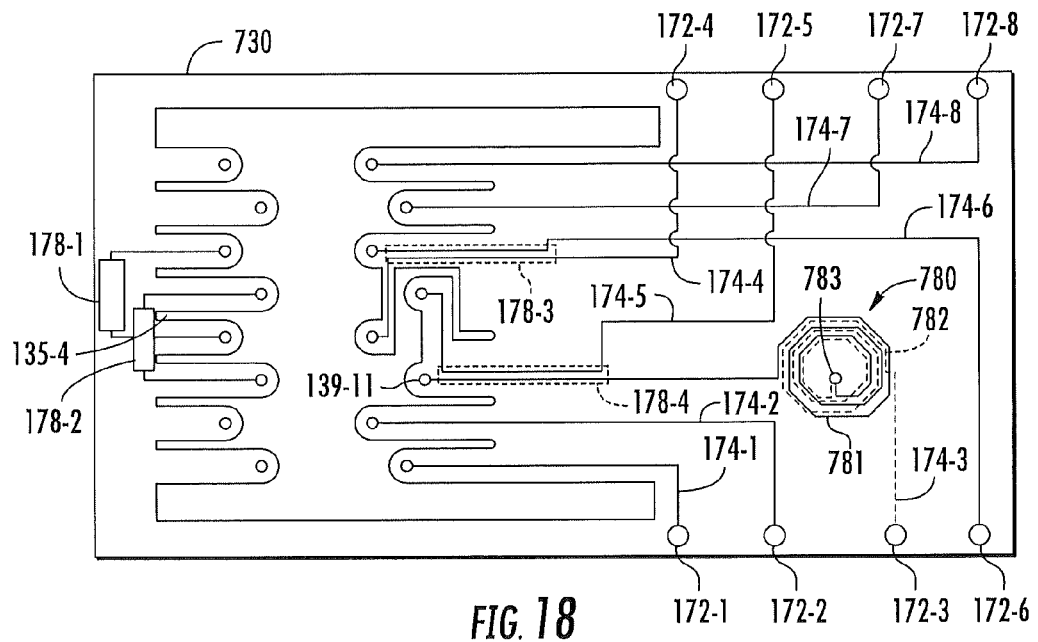
FIG. 18 is a schematic plan view of a flexible printed circuit board of a communications insert according to yet additional embodiments of the present invention.

FIG. 18 illustrates a flexible printed circuit board 730 for a communications jack according to yet additional embodiments of the present invention that may provide this improved return loss performance. The flexible printed circuit board 730 may be used in place of the flexible printed circuit board 130 in the communications insert 120 discussed above with respect to FIGS. 3-9. As the flexible printed circuit board 730 is quite similar to the flexible printed circuit board 130, the discussion below will focus on the additional feature (namely a return loss improvement circuit) that is included on the flexible printed circuit board 730.

As shown in FIG. 18, a return loss improvement circuit 780 is provided on the flexible printed circuit board 730. The return loss improvement circuit 780 is implemented as a pair of spirals 781, 782 that are included in the conductive path 174-3 that connects jackwire contact 140-3 to its respective IDC 170-3. The spiral 781 is on the top side of flexible printed circuit board 730. A segment of the conductive path 174-3 connects the metal-plated aperture 139-11 to the outer end of spiral 781. The spiral 781 winds inwardly (clockwise in FIG. 18) in increasingly smaller generally circular sections that are immediately adjacent each other and which have substantially the same instantaneous current direction. The immediate adjacency of trace sections having substantially the same instantaneous current direction in spiral 781 causes self-coupling between the adjacent windings of the spiral 781, which in turn triggers an increase in localized inductance.

As is discussed, for example, in U.S. Pat. No. 7,326,089, issued Feb. 5, 2008, the entire content of which is incorporated herein by reference as if set forth in its entirety, the use of self-coupling conductors that generate a localized increase in self-inductance may be used to improve the return loss on one more differential transmission lines through a communications connector. In particular, by judicious selection of the portions of a conductive path that are immediately adjacent each other with identical or substantially identical instantaneous current direction it may be possible to control the input impedance of a differential transmission line through a mated plug-jack combination, and, consequently, it may be possible to control the return loss of the differential transmission line. As a result, the jack of the mated plug jack combination can withstand the increased crosstalk compensation that may be necessary to achieve, in a mated plug-jack combination, elevated frequency signal transmission while still experiencing acceptable levels of return loss.

As is further shown in FIG. 18, when a signal reaches the inner end of the spiral 781 it is coupled onto the conductive via 783 that extends between the top and bottom layers of the flexible printed circuit board 730. The signal then traverses the spiral 782, which winds outwardly (clockwise in FIG. 18) in increasingly larger generally circular sections that are immediately adjacent each other and which have substantially the same instantaneous current direction. The immediate adjacency of trace sections having substantially the same instantaneous current direction in spiral 782 causes self-coupling between the adjacent rings of the spiral 782, which in turn triggers an increase in localized inductance. The outer end of spiral 782 connects to the via 172-3.

The spiral 782 substantially overlaps the spiral 781. Additionally, the instantaneous current direction of a signal traversing the spirals 781 and 782 will be the same (i.e., depending on the current polarity, either a signal will flow through both spirals 781, 782 in the clockwise direction or will flow through both spirals 781, 782 in the counter-clockwise direction). Consequently, localized increases in inductance along trace 174-3 will be obtained by (1) the coupling between immediately adjacent sections in the spiral 781, (2) the coupling between immediately adjacent sections in the spiral 782 and (3) the coupling between the overlapping sections of spirals 781 and 782. Accordingly, significant amounts of inductive self-coupling may be achieved. This is particularly true when the spirals 781, 782 are implemented on a flexible printed circuit board because, as discussed above, flexible printed circuit boards may have very thin dielectric layers and hence substantial amounts of inductive coupling may be achieved between overlapping traces on a flexible printed circuit board. In other embodiments, the spirals may be arranged to reduce the self-inductance of the path, by having the current running in opposite directions in the two spiral paths. Thus, it will be appreciated that the current direction in the two spirals may be selected based on whether or not more or less self-inductance is desirable. It will also be appreciated that geometric arrangements other than spirals may be used to achieve segments on the two conductors of a differential transmission line that have substantially the same or substantially opposite instantaneous current directions.

In addition, the arrangement of the spirals 781, 782 that are depicted in FIG. 18 may also generate substantial amounts of self-capacitance on conductive path 174-3. In particular, given the thin nature of the dielectric layer of the flexible printed circuit board 730, the spiral 781 will capacitively couple with the spiral 782. This capacitive coupling may further improve the return loss on the differential transmission line that includes conductive trace 174-3. Moreover, heightened levels of capacitive self-coupling may be achieved by widening the conductive traces that are used to form the spirals 781, 782.

By generating both self-inductance and self-capacitance along the conductive trace 174-3 it may be possible to provide a significant improvement in the return loss of the differential transmission line that includes conductive trace 174-3. It may be difficult, in some instances, to provide this degree of improvement in return loss by generating only self-inductance as the amount of room or "real estate" on the printed circuit boards used in many communications connectors such as RJ-45 jacks may be quite limited, and this constraint may limit the length of the inductively self-coupling sections. In some embodiments, the amount of capacitive coupling generated along a conductive path such as conductive path 174-3 may be at least half the amount of the inductive coupling. In some embodiments, the amount of capacitive coupling generated along the conductive path may exceed the amount of inductive coupling.

Moreover, pursuant to some embodiments of the present invention, the ratio of the self-capacitance to the self-inductance may be tuned to improve the return loss on the transmission line. In particular, it has been discovered that by generating both self-inductance, and self-capacitance along a differential transmission line that resonances may be created. By adjusting the relative amount of self-capacitance to self-inductance these resonances may be tuned so as to create a local maxima in the return loss spectra.

Figure 18A:
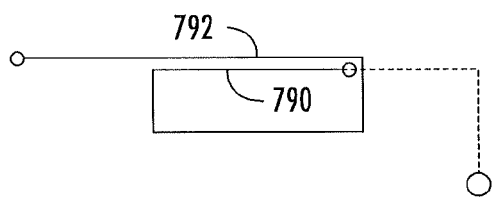
FIG. 18A is a schematic plan view of the traces of a differential transmission line illustrating how parallel trace sections having the same instantaneous current direction may be used to generate a localized increase in inductance.
Figure 18B:
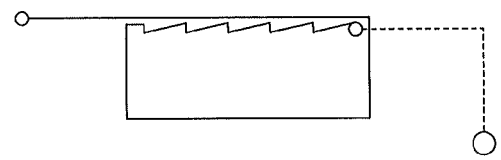
FIG. 18B is a schematic plan view illustrating how the trace sections of FIG. 18B need not be perfectly parallel to generate the localized increase in inductance.

While the spirals 781, 782 are used to provide trace segments along conductive path 174-3 that have substantially the same instantaneous current direction, it will be appreciated that other trace configurations may be used. For example, two parallel trace sections 790, 792 that have the same instantaneous current direction may be used instead, as is shown schematically in FIG. 18A. It will also be appreciated that the improvement in return loss may be achieved even if the traces do not have the exact same instantaneous current direction. Thus, it will be appreciated that the trace segments need not be exactly parallel as shown in FIG. 18B.

While only one pair of spirals 781, 782 is illustrated in FIG. 18, it will be appreciated that in other embodiments more than one pair of spirals may be provided and/or that the spirals may be included on different of the conductive paths 174. By way of example, in another embodiment, a second pair of spirals may be provided on conductive trace 174-6 that may be identical to the pair of spirals 781, 782. In still other embodiments, pairs of spirals may be included, for example, on conductive trace 174-4 and/or on conductive trace 174-5. While the inclusion of self-coupling sections in the conductors of pairs 1 and 3 may often be sufficient for improving the return loss performance of those pairs; it will also be appreciated that this concept can be applied to either or both of pairs 2 and 4, or to other conductors of jacks that employ different numbers of conductors (e.g., a sixteen conductor jack). Also, although in the illustrated embodiment the self-coupling is achieved both by the adjacency of self-coupling sections on the same layer of the flexible printed circuit board and by the overlapping nature of the two spirals that are provided on different layers of the flexible printed circuit board, it will be appreciated that in other embodiments the self-coupling may only occur in one of these two dimensions. Moreover, the skilled artisan will recognize that many different conductive paths that implement these concepts may be employed. Thus, it will be appreciated that FIG. 18 merely shows an example of this concept, and is not intended to be limiting.

Figure 19A:
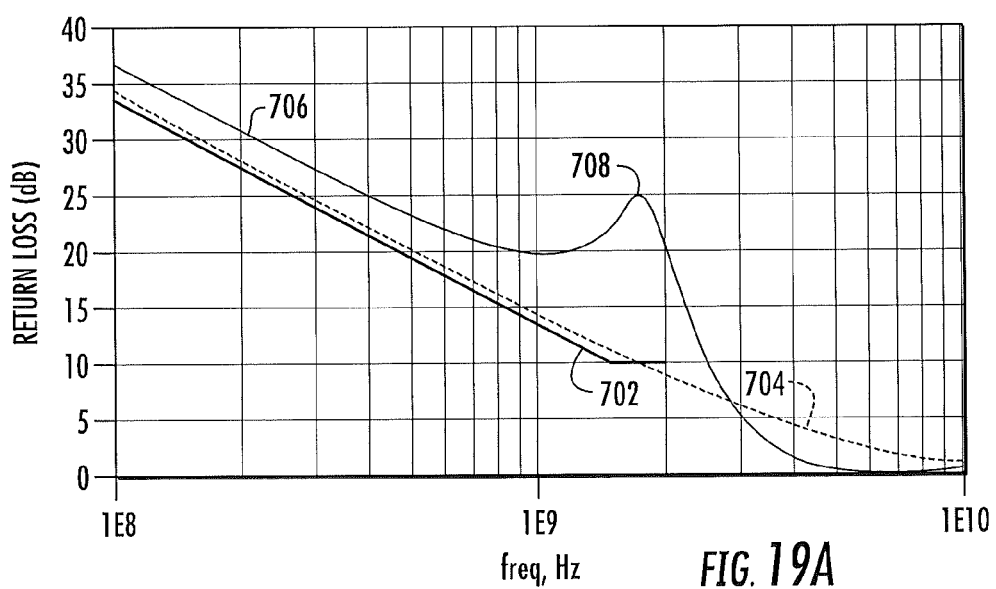
FIG. 19A is a schematic graph that illustrates how the relative amounts of inductive and capacitive self-coupling may be tuned to generate a local maximum in the return loss spectrum for a differential transmission line according to embodiments of the present invention.
Figure 19:
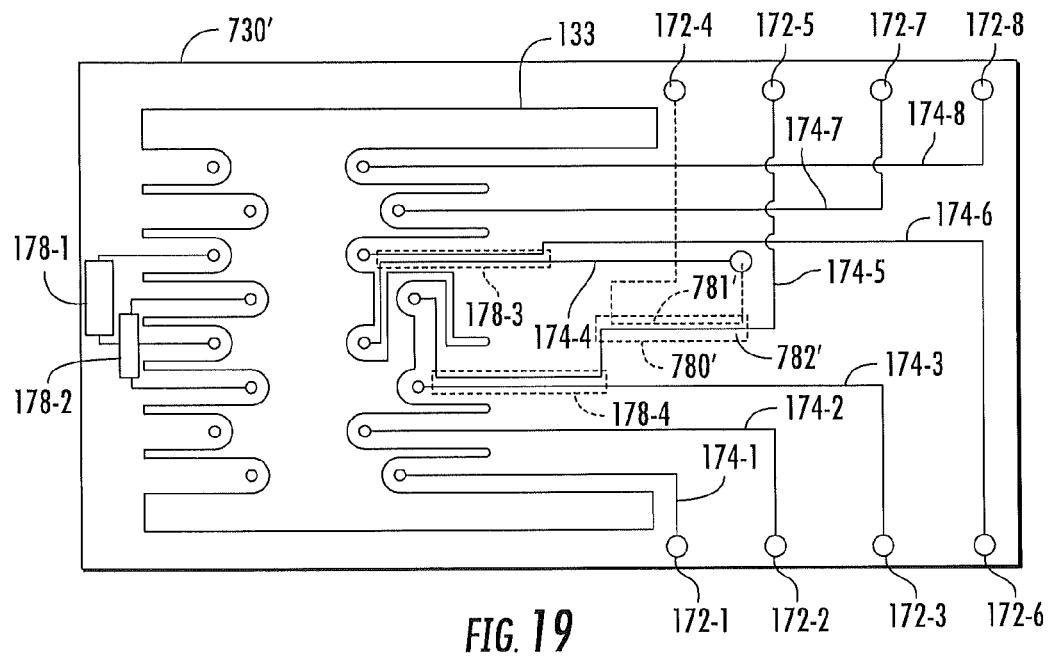
FIG. 19 is a schematic plan view of a flexible printed circuit board of a communications insert according to even further embodiments of the present invention.

FIG. 19 is a schematic plan view of both the top and bottom layers of a flexible printed circuit board 730' according to further embodiments of the present invention. The flexible printed circuit board 730' is quite similar to the flexible printed circuit board 730 discussed above. Thus, the description that follows will focus on the differences between the two flexible printed circuit boards 730, 730'.

As is readily apparent, the difference between the two flexible printed circuit board designs 730, 730' is that the flexible printed circuit board 730' replaces the return loss improvement circuit 780 (which comprised spirals 781 and 782) with a return loss improvement circuit 780'. The return loss improvement circuit 780' operates in a similar manner to circuit 780, but generates the localized increases in inductance and capacitance using the two conductive paths of a differential transmission line as opposed to by using only one of the conductive paths. In the embodiment of FIG. 19, the return loss improvement circuit is implemented on pair 1 as opposed to pair 3 as the traces of pair 1 are more conveniently located near each other.

In particular, as shown in FIG. 19, the return loss improvement circuit 780' is formed by running a section 781' of conductive path 174-4 on the bottom side of the flexible printed circuit board 730' and by running a section 782' of conductive path 174-5 on the top side of the flexible printed circuit board 730' above section 781'. As the currents on the two conductive paths 174-4, 174-5 are 180 degrees out of phase (since the two conductive paths 174-4 and 174-5 form a differential transmission line), one of the traces 174-4 or 174-5 (here trace 174-4) is routed in the opposite direction by, for example, including a pair of 180 degree turns in the trace 174-4 and routing the section 781' of trace 174-4 that is between the two 180 degree turns underneath section 782' of conductive trace 174-3. As explained, for example, in U.S. Pat. No. 7,264,516, issued Sep. 4, 2007, the entire contents of which are incorporated herein by reference, the trace sections 781', 782' that are immediately adjacent each other and that follow substantially parallel paths will have the same instantaneous current direction. The immediate adjacency of this arrangement causes coupling between the sections 781', 782' which in turn triggers an increase in localized inductance.

Moreover, since the sections 781', 782' are implemented on opposite sides of a flexible printed circuit board 730', the sections 781', 782' will both inductively couple and capacitively couple. The techniques for adjusting the relative amounts of capacitive and inductive coupling that are discussed above with respect to FIG. 18 may also be applied in the embodiment of FIG. 19 to generate a local maximum in the return loss spectrum and to locate that local maximum in a location that provides desired return loss performance for the differential transmission line. For example, FIG. 19A schematically illustrates how the above-described self-coupling may generate a local maximum in the return loss spectrum (i.e., the return loss plotted as a function of frequency) for a differential transmission line. In particular, FIG. 19A depicts the return loss of an example differential transmission line as a function of frequency (plot 704). A possible return loss limit currently under consideration by the TIA standards body is also depicted in FIG. 19A (plot 702). As shown in FIG. 19A, at higher frequencies it may be difficult to meet such a return loss limit. By providing sections on at least one of the conductive paths of the differential transmission line that both inductively self-couple and capacitively self-couple, it may be possible to provide improved return loss, as shown by plot 706 in FIG. 19A. This improvement may take the form of a local maximum 708 in the return loss spectrum. By adjusting the relative amounts of self-inductance and self-capacitance injected on the conductive path of the differential transmission line, the location of this local maximum may be adjusted. In some embodiments, the local maximum may be located near a maximum operating frequency for the connector at issue (e.g., between 60% and 125% of the maximum operating frequency). This may provide for a significant improvement in the return loss of the differential transmission line at issue in the region where improved performance may be most needed. The ratio of self-inductance to self-capacitance can be adjusted, for example, by adjusting the widths of the self-coupling traces (as increased width generates relatively more self-capacitance) and/or by adjusting the amount of overlap of the traces on the opposite sides of the printed circuit board.

Pursuant to still further embodiments of the present invention, crosstalk compensation circuits are provided that are implemented on flexible printed circuit boards in order to achieve high amounts of crosstalk compensation with very short coupling sections. As discussed above, the dielectric layers on flexible printed circuit boards may be very thin (e.g., 1 mil). This allows for significant amounts of coupling between overlapping traces that are implemented on either side if the flexible printed circuit board. As inductive crosstalk compensation requires current flow, it necessarily is spread out in time. When crosstalk compensation is spread over time, it necessarily involves an associated delay. As all other parameters being equal, improved crosstalk compensation may generally be provided the shorter the delay, the ability to introduce large amounts of inductive crosstalk compensation within very short trace segments may be desirable. Communications jacks that implement this technique are provided pursuant to further embodiments of the present invention.

Figure 20:
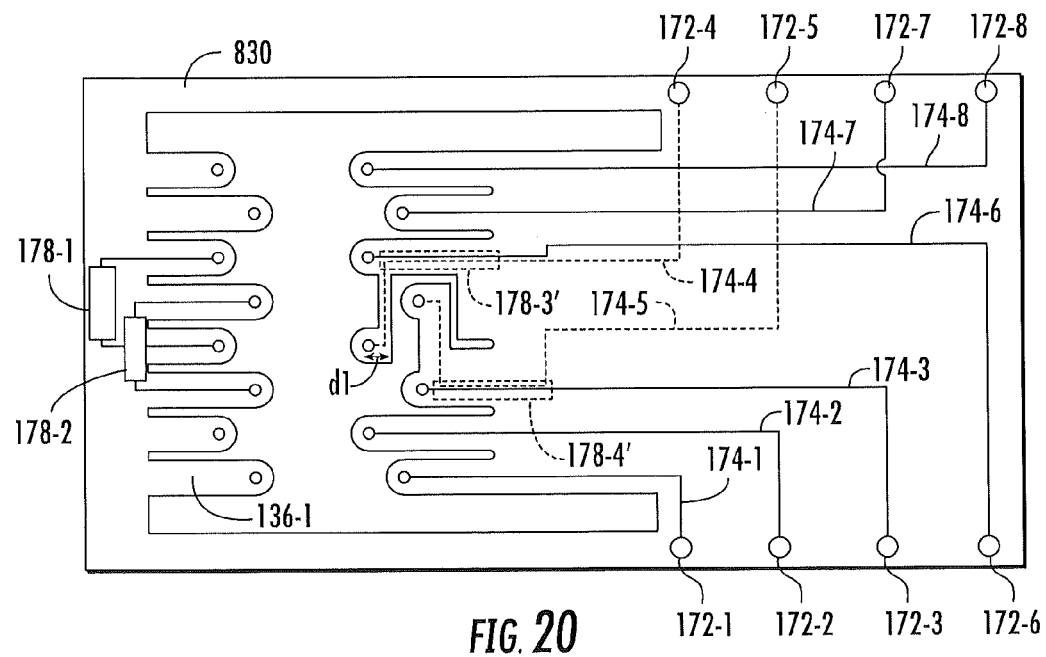
FIG. 20 is a schematic plan view of a flexible printed circuit board of a communications insert according to still further embodiments of the present invention.

In particular, FIG. 20 is a schematic plan view of both the top and bottom layers of a flexible printed circuit board 830 of a communications insert according to even further embodiments of the present invention. As shown in FIG. 20, the flexible printed circuit board 830 is very similar to the flexible printed circuit board 130 discussed above. Thus, the description that follows will focus on the differences between the two flexible printed circuit boards 130, 830. It will be appreciated that the flexible printed circuit board 830 may be used in place of the flexible printed circuit board 130 in the communications insert 120 of jack 100.

As shown in FIG. 20, the inductive crosstalk compensation circuits 178-3 and 178-4 of flexible printed circuit board 130 are replaced with inductive crosstalk compensation circuits 178-3' and 178-4'. One difference between circuits 178-3, 178-4 and 178-3', 178-4' are that the former circuits provide inductive crosstalk compensation by inductively coupling traces that run side-by-side on the same layer of the flexible printed circuit board 130 while the latter circuits provide inductive crosstalk compensation by inductively coupling traces that run in overlapping fashion on opposite sides of the flexible printed circuit board 830. As noted above, much higher levels of inductive coupling can be achieved via this arrangement, and hence the length of the inductive coupling sections may be shortened. The effect of this is to push the centroid of the inductive coupling sections closer to the plug contact regions of the jackwire contacts 140, and hence at a smaller delay from the plug contact region. This may improve the crosstalk cancellation, particularly for high frequency signals.

Figure 21:
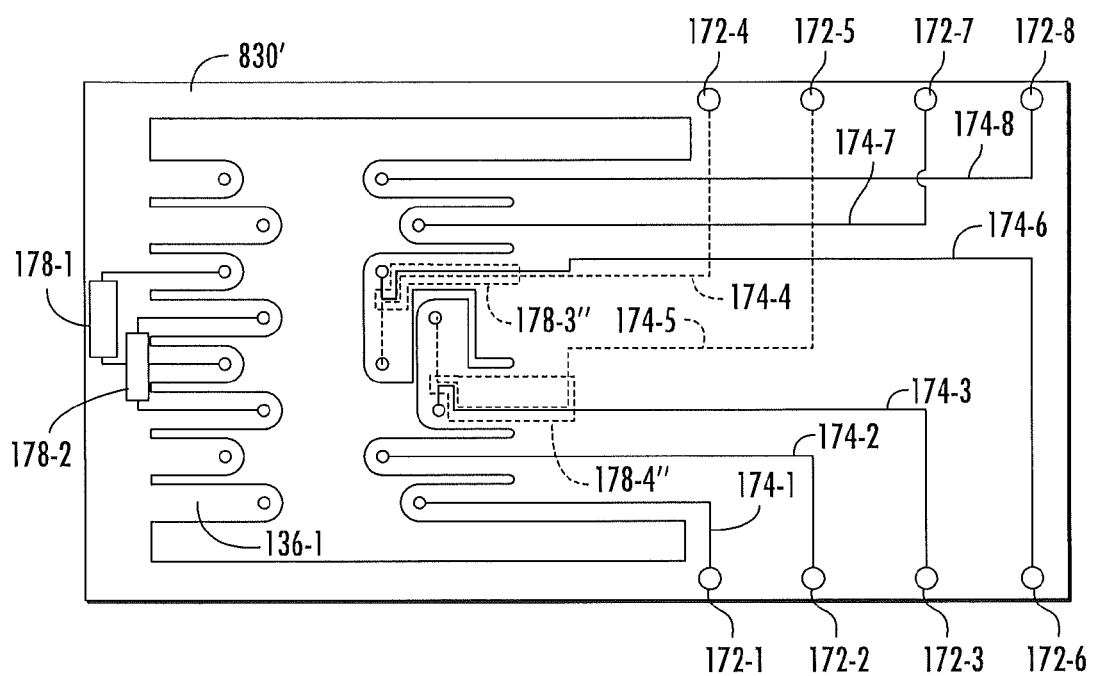
FIG. 21 is a schematic plan view of a flexible printed circuit board of a communications insert according to yet additional embodiments of the present invention.

Pursuant to still further embodiments of the present invention, crosstalk compensation circuits are provided in which crosstalk compensation is optimized by minimizing the longitudinal signal travel between offending crosstalk and the location where like polarized conductive traces from two different pairs are made to couple. This is achieved by transversely routing these conductive traces throughout their travel from where they are intercepted by their corresponding jackwire contacts to where they couple by running parallel in an overlapped or side-by-side manner. In particular, FIG. 21 is a schematic plan view of both the top and bottom layers of a flexible printed circuit board 830' of a communications insert according to such an embodiment. As shown in FIG. 21, the flexible printed circuit board 830' is very similar to the flexible printed circuit board 830 discussed above. Thus, the description that follows will focus on the differences between the two flexible printed circuit boards 830 and 830'. It will be appreciated that the flexible printed circuit board 830' may be used in place of the flexible printed circuit board 130 in the communications insert 120 of jack 100. The only difference between circuits 830 and 830' is that the former circuit provides each of the inductive crosstalk couplings 178-3' and 178-4' after a longitudinal signal travel, indicted by d1 in FIG. 20, while by contrast the inductive crosstalk couplings 178-3" and 178-4" are each provided in the latter circuit without the signal having to incur such a longitudinal travel. The effect of this is to reduce the delay between the offending crosstalk and the location where the inductive crosstalk is commenced which would improve the crosstalk cancellation, particularly for high frequency signals.

For very high frequency signals, reducing or minimizing the amount of the delay before the inductive (and possibly capacitive) crosstalk compensation is injected by the inductive crosstalk coupling circuits 178-3" and 178-4" may be important. Thus, in some embodiments, the start of the coupling sections 178-3" and 178-4" may be located along a transverse plane defined by the conductive vias 139-12 and 139-14 that hold the back ends of jackwire contacts 140-4 and 140-6. In such embodiments, a first distance that is defined as the distance between the top of via 139-12 (i.e., the intercept of jackwire contact 140-4 and the top surface of the flexible printed circuit board 830') and the top of via 139-14 (i.e., the intercept of jackwire contact 140-6 and the top surface of the flexible printed circuit board 830') may be substantially equal to a second distance that is defined as the sum of (1) the distance between the top of via 139-12 and the coupling section 178-3" and (2) the distance between the top of via 139-14 and the coupling section 178-3". In other embodiments, the second distance may be as much as twice the first distance, although the greater the second distance the more that the impact of delay may negatively impact crosstalk cancellation for high frequency signals.

While embodiments of the present invention have primarily been discussed herein with respect to communications jacks that include eight conductive paths that are arranged as four differential pairs of conductive paths, it will be appreciated that the concepts described herein are equally applicable to jacks that include other numbers of differential pairs.

While the present invention has been described above primarily with reference to the accompanying drawings, it will be appreciated that the invention is not limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "under", "below", "lower", "over", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. As one specific example, various features of the communications jacks of the present invention are described as being, for example, on or above a top surface of a printed circuit board. It will be appreciated that if elements are on the bottom surface of a printed circuit board, they will be located on the top surface if the jack is rotated 180 degrees. Thus, the term "top surface" can refer to either the top surface or the bottom surface as the difference is a mere matter of orientation.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, operations, elements, and/or components, but do not preclude the presence or addition of one or more other features, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Herein, the terms "attached", "connected", "interconnected", "contacting", "mounted" and the like can mean either direct or indirect attachment or contact between elements, unless stated otherwise.

Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A Registered Jack-45 ("RJ-45") communications jack having a longitudinal axis, comprising:
   a housing having a plug aperture that is configured to receive a mating RJ-45 plug along the longitudinal axis;

eight jackwire contacts that are arranged as four differential pairs of jackwire contacts, each of the jackwire contacts including a plug contact region that extends into the plug aperture;
wherein a first of the jackwire contacts is configured to engage a flat portion of a longitudinally extending surface of a first blade of the mating RJ-45 plug when the mating RJ-45 plug is fully received within the plug aperture, and
wherein a plug contact region of a second of the jackwire contacts is staggered with respect to a plug contact region of the first of the jackwire contacts in the longitudinal direction.

2. The RJ-45 communications jack of claim 1, wherein the second of the jackwire contacts is also configured to engage a longitudinally extending surface of a second blade of the mating RJ-45 plug when the mating RJ-45 plug is fully received within the plug aperture.

3. The RJ-45 communications jack of claim 2, wherein, when the mating RJ-45 plug is fully received within the plug aperture, the first jackwire contact engages the longitudinal surface of the first blade of the mating RJ-45 plug at a first distance from a plane defined by a front opening of the plug aperture, and the second jackwire contact engages the longitudinal surface of the second blade of the mating RJ-45 plug at a second distance from the plane defined by the front opening of the plug aperture, wherein the second distance exceeds the first distance.

4. The RJ-45 communications jack of claim 3, wherein the second distance exceeds the first distance by at least 20 mils.

5. The RJ-45 communications jack of claim 1, wherein the second of the jackwire contacts is configured to engage a curved surface of a second blade of the mating RJ-45 plug when the mating RJ-45 plug is fully received within the plug aperture, wherein the curved surface connects a longitudinally extending surface of the second blade to a front surface of the second blade.

6. The RJ-45 communications jack of claim 1, wherein the plug contact regions of the first and second of the jackwire contacts are offset longitudinally, transversely and vertically when the mating RJ-45 plug is fully received within the plug aperture.

7. The RJ-45 communications jack of claim 1, wherein the second through eighth jackwire contacts are also configured to engage respective longitudinal surfaces of respective second through eighth blades of the mating RJ-45 plug when the mating RJ-45 plug is fully received within the plug aperture.

8. The RJ-45 communications jack of claim 7, wherein, when the mating RJ-45 plug is fully received within the plug aperture, a first subset of the jackwire contacts engage the longitudinal surfaces of ones of the first through eighth blades of the mating RJ-45 plug blades at a first distance from a plane defined by a front opening of the plug aperture, and wherein a second subset of the jackwire contacts engage the longitudinal surfaces of ones of the first through eighth blades of the mating RJ-45 plug blades at a second distance from the plane defined by the front opening of the plug aperture, wherein the second distance exceeds the first distance.

9. The RJ-45 communications jack of claim 8, wherein the eight jackwire contacts comprise four tip jackwire contacts and four ring jackwire contacts, wherein each differential pair of jackwire contacts includes a respective one of the tip jackwire contacts and a respective one of the ring jackwire contacts, and wherein the tip jackwire contacts are all at the same distance from the plane defined by the front opening of the plug aperture, and wherein the ring jackwire contacts are all at the same distance from the plane defined by the front opening of the plug aperture.

10. The RJ-45 communications jack of claim 1, wherein each of the jackwire contacts is mounted to extend from a top surface of a printed circuit board, and wherein the portion of each jackwire contact that is at a maximum height above a plane defined by the top surface of the printed circuit board is the plug contact region of the jackwire contact.

11. The RJ-45 communications jack of claim 1, wherein each of the first through eighth blades of the mating RJ-45 plug have a front surface that is at least partially exposed along a front surface of the mating RJ-45 plug that is opposite a cable that is attached to the mating RJ-45 plug, a bottom surface that is at least partially exposed along a bottom surface of the mating RJ-45 plug, and a curved transition region that connects the front surface of each of the respective first through eighth blades to the bottom surface of the respective first through eighth blades, wherein each of the jackwire contacts engages a respective one of the first through eighth blades along the bottom surface thereof when the mating RJ-45 plug is received within the plug aperture.

12. A Registered Jack-45 ("RJ-45") communications jack, comprising:
a housing having a plug aperture that defines a longitudinal plug insertion axis;
a first jackwire contact, a second jackwire contact, a third jackwire contact, a fourth jackwire contact, a fifth jackwire contact, a sixth jackwire contact, a seventh jackwire contact and an eighth jackwire contact, the fourth and fifth jackwire contacts forming a first differential pair of jackwire contacts, the first and second jackwire contacts forming a second differential pair of jackwire contacts, the third and sixth jackwire contacts forming a third differential pair of jackwire contacts, and the seventh and eighth jackwire contacts forming a fourth differential pair of jackwire contacts, each of the first through eighth jackwire contacts including a plug contact region, the plug contact regions of the first through eighth jackwire contacts being positioned transversely across the plug aperture in numerical order,
wherein the plug contact regions of at least some of the third through sixth jackwire contacts are staggered with respect to each other in the longitudinal direction so that the third jackwire contact couples at least as much with the fifth jackwire contact as it does with the fourth jackwire contact.

13. The RJ-45 communications jack of claim 12, wherein the plug contact regions of at least some of the third through sixth jackwire contacts are also staggered with respect to each other in the longitudinal direction so that the sixth jackwire contact couples at least as much with the fourth jackwire contact as it does with the fifth jackwire contact.

14. The RJ-45 communications jack of claim 12, wherein each of the first through eighth jackwire contacts is substantially identical.

15. The RJ-45 communications jack of claim 14, wherein the first, third, fifth and seventh jackwire contacts are substantially aligned in a first row, and wherein the second, fourth, sixth and eighth jackwire contacts are substantially aligned in a second row that is longitudinally offset from the first row.

16. The RJ-45 communications jack of claim 12, wherein the plug blade contact regions of at least half of the first through eighth jackwire contacts are configured to mate with a flat bottom portion of a respective plug blade of a mating RJ-45 plug when the mating RJ-45 plug is fully received within the plug aperture.

17. The RJ-45 communications jack of claim 12, further comprising a flexible printed circuit board that electrically connects each of the first through eighth jackwire contacts to respective ones of first through eighth output terminals of the RJ-45 communications jack.

18. The RJ-45 communications jack of claim 17, wherein each jackwire contact has a first end that is mounted in the flexible printed circuit board and a second end that is also mounted in a mounting substrate.

19. A communications jack, comprising:
a housing having a plug aperture that defines a longitudinal plug insertion axis;
a printed circuit board that is at least partially mounted within the housing;
a plurality of longitudinally extending jackwire contacts that are disposed transversely across the plug aperture, wherein each jackwire contact has a base portion and a plug contact surface;
a flexible printed circuit board that is mounted on at least two of the jackwire contacts, the flexible printed circuit board including at least one crosstalk compensation circuit,
wherein the plug contact surfaces of a first subset of the jackwire contacts are substantially aligned in a first transverse row, and the plug contact surfaces of a second subset of the jackwire contacts are substantially aligned in a second transverse row that is offset from the first transverse row.

20. The communications jack of claim 19, wherein the flexible printed circuit board comprises a first flexible printed circuit board, and wherein the printed circuit board comprises a second flexible printed circuit board.

21. The communications jack of claim 20, wherein the first flexible printed circuit board includes a fold and/or a slit.

22. The communications jack of claim 20, wherein the plurality of jackwire contacts comprises a first jackwire contact, a second jackwire contact, a third jackwire contact, a fourth jackwire contact, a fifth jackwire contact, a sixth jackwire contact, a seventh jackwire contact and an eighth jackwire contact, the fourth and fifth jackwire contacts forming a first differential pair of jackwire contacts, the first and second jackwire contacts forming a second differential pair of jackwire contacts, the third and sixth jackwire contacts forming a third differential pair of jackwire contacts, and the seventh and eighth jackwire contacts forming a fourth differential pair of jackwire contacts, and wherein the at least one crosstalk compensation circuit comprises at least one capacitor coupled between the third jackwire contact and the fifth jackwire contact.

23. The communications jack of claim 22, further comprising a third flexible printed circuit board that is mounted on the fourth jackwire contact and the sixth jackwire contact, the third flexible printed circuit board including a second crosstalk compensation circuit that comprises at least one capacitor coupled between the fourth jackwire contact and the sixth jackwire contact.

24. The communications jack of claim 20, wherein the first flexible printed circuit board is mounted to portions of the at least two of the jackwire contacts that are on opposite sides of the contacts from the plug contact surfaces of the at least two jackwire contacts.

25. The communications jack of claim 20, wherein the first crosstalk compensation circuit comprises a pair of inductively coupling traces on the first flexible printed circuit board or a at least one trace that inductively couples with one of the jackwire contacts.

26. The communications jack of claim 20, wherein the plug contact surfaces of the first subset of the jackwire contacts remain substantially aligned in a first transverse row when a mating RJ-45 plug is received in a plug aperture of the communications jack, and wherein the plug contact surfaces of the second subset of the jackwire contacts remain substantially aligned in a second transverse row that is offset in the longitudinal direction from the first transverse row when the mating RJ-45 plug is received in the plug aperture of the communications jack.

* * * * *